(12) United States Patent
Gao et al.

(10) Patent No.: US 7,570,074 B2
(45) Date of Patent: Aug. 4, 2009

(54) ELECTRONIC OVERLOAD RELAY FOR MAINS-FED INDUCTION MOTORS

(75) Inventors: Zhi Gao, Atlanta, GA (US); Thomas G. Habetler, Snellville, GA (US); Ronald G. Harley, Lawrenceville, GA (US); Roy Stephen Colby, Raleigh, NC (US)

(73) Assignee: Square D Company, Palatine, IL (US)

( * ) Notice: Subject to any disclaimer, the term of this patent is extended or adjusted under 35 U.S.C. 154(b) by 452 days.

(21) Appl. No.: 11/125,352

(22) Filed: May 9, 2005

(65) Prior Publication Data

US 2006/0250154 A1   Nov. 9, 2006

(51) Int. Cl.
G01R 31/34 (2006.01)
G01R 31/28 (2006.01)
(52) U.S. Cl. .................................... 324/772
(58) Field of Classification Search .............. 324/158.1, 324/760–772; 318/490, 520–523
See application file for complete search history.

(56) References Cited

U.S. PATENT DOCUMENTS

| | | | |
|---|---|---|---|
| 4,319,298 A | 3/1982 | Davis et al. | |
| 4,413,325 A | 11/1983 | Elfner et al. | |
| 4,914,386 A | 4/1990 | Zocholl | |
| 4,980,624 A | 12/1990 | Bernhardt | |
| 4,987,674 A * | 1/1991 | Denk | 29/596 |
| 5,283,708 A | 2/1994 | Waltz | |
| 5,436,784 A | 7/1995 | Schweitzer, III et al. | |
| 5,761,018 A | 6/1998 | Blakely | |
| 6,621,291 B2 * | 9/2003 | Lee et al. | 324/772 |
| 6,847,187 B2 * | 1/2005 | Kumar | 318/783 |
| 2004/0206341 A1 * | 10/2004 | Clarkson et al. | 123/564 |
| 2006/0176005 A1 * | 8/2006 | Ta et al. | 318/650 |

OTHER PUBLICATIONS

Sang-Bin Lee, Thomas G. Habetler, Ronald G. Harley, David J. Gritter; An Evaluation of Model-Based Stator Resistance Estimation for Induction Motor Stator Winding Temperature Monitoring; Mar. 2002; IEEE Transactions on Energy Conversion, vol. 17, No. 1.

Hurst K D et al.: "A Thermal Monitoring and Parameter Tuning Scheme for Induction Machines" IEEE Industry Applications Conference, 1997. New Orleans, LA, USA, Conference Record of the 1997 IEEE , Oct. 5-9, 1997, NY,NY, vol. 1, pp. 136-142.

(Continued)

Primary Examiner—Jermele Hollington
Assistant Examiner—Trung Q Nguyen

(57) ABSTRACT

An induction motor having a rotor and a stator is protected during running overloads by connecting the motor to an overload protection relay that can be tripped to interrupt power to the motor in the event of an overload, tracking the stator winding temperature of the motor during running overloads with a hybrid thermal model by online adjustment in the hybrid thermal model, and tripping the overload protection relay in response to a predetermined running overload condition represented by the tracked stator winding temperature. In one embodiment of the invention, the stator winding temperature is tracked by use of an online hybrid thermal model that uses the resistance of the rotor as an indicator of rotor temperature and thus of the thermal operating conditions of the motor. The hybrid thermal model incorporates rotor losses and heat transfer between the rotor and the stator, and approximates the thermal characteristics of the rotor and stator.

26 Claims, 13 Drawing Sheets

OTHER PUBLICATIONS

Kral C et al: "Rotor Temperature Estimation of Squirrel Cage Induction Motors by Means of a Combined Scheme of Parameter Estimation and a Thermal Equivalent Model" Electric Machines & Drives Conference 2003. IEMDC '03. IEEE Jun. 1-4, 2003, vol. 2, pp. 931-937.

Beguenane R et al: "Induction Motors Thermal Monitoring by Means of Rotor Resistance Identification" IEEE Transactions on Energy Conversion, IEEE Service Center Piscataway, NJ vol. 14, No. 3, Sep. 1999, pp. 566-570.

Gao Z et al: "An Online Adaptive Stator Winding Temperature Estimator Based on a Hybrid Thermal Model for Induction Machines" Electric Machines and Drives, 2005 IEEE Conf. Piscataway, NJ, USA, May 15, 2005, pp. 754-761.

* cited by examiner

ELECTRONIC OVERLOAD RELAY FOR MAINS-FED INDUCTION MOTORS

FIELD OF THE INVENTION

This invention is directed generally to electronic overload relays for mains-fed induction motors. More particularly, this invention pertains to a system for controlling electronic overload relays for mains-fed induction motors.

BACKGROUND OF THE INVENTION

The permissible temperature limit for the winding of a motor is primarily determined by the motor's insulation. Applicable standards (UL, CSA, IEC, and NEMA) distinguish different classes of insulation and corresponding temperature limits. Typical allowable temperatures inside the stator windings are given in *Information Guide for General Purpose Industrial AC Small and Medium Squirrel-Cage Induction Motor Standards*, NEMA Standard MG1-2003, August 2003.

If the motor is working continuously in an over-temperature condition, the aging process is accelerated. This is a chemical process that involves the deterioration of the insulation material. It is often assumed that a winding temperature that is constantly 10° C. higher than the temperature limit reduces the motor life by half. This life law shows that particular attention must be paid to adhering to the permitted operating temperature for long periods of time.

Various standards have been established to provide general guidelines in estimating stator winding temperature for motor overload protection. See, e.g., *IEEE Guide for AC Motor Protection*, IEEE Standard C37.96-2000, March, 2000; *Guide for the Presentation of Thermal Limit Curves for Squirrel Cage Induction Machines*, IEEE Standard 620-1996, June, 1996; and *IEEE Standard Inverse-time Characteristic Equations for Overcurrent Relays*, IEEE Standard C37.112-1996, September, 1996.

Many manufacturers provide motor protective relays based on a thermal model with a single thermal time constant, derived from the temperature rise in a uniform object.

SUMMARY OF THE INVENTION

In accordance with one embodiment of the present invention, an induction motor having a rotor and a stator is protected during running overloads by connecting the motor to an overload protection relay that can be tripped to interrupt power to the motor in the event of an overload, tracking the stator winding temperature of the motor during running overloads with a hybrid thermal model by online adjustment in the hybrid thermal model, and tripping the overload protection relay in response to a predetermined running overload condition represented by the tracked stator winding temperature. As used herein, the term "online" means that the measurements, calculations or other acts are made while the motor is in service, connected to a load and running. A running overload is typically a condition in which the stator current is in the range of from about 100% to about 200% of the rated current of the motor, with motor continuously running.

In one embodiment of the invention, the stator winding temperature is tracked by use of an online hybrid thermal model that uses the resistance of the rotor as an indicator of rotor temperature and thus of the thermal operating conditions of the motor. The hybrid thermal model incorporates rotor losses and heat transfer between the rotor and the stator, and approximates the thermal characteristics of the rotor and stator.

One embodiment of the hybrid thermal model includes adjustable thermal parameters that permit the hybrid thermal model to be tuned when it does not match the actual thermal operating condition of the motor, to adapt the hybrid thermal model to the cooling capability of the motor. The match between the hybrid thermal model and the actual thermal operating condition of the motor can be measured by a function of the difference between a rotor temperature estimated using the online hybrid thermal model and a rotor temperature estimated from the estimated rotor resistance, and the tuning is effected when the error exceeds a predetermined threshold.

Thus, the invention can provide a system for estimating stator winding temperature by an adaptive architecture, utilizing the rotor resistance as an indication of rotor temperature, and consequently the motor thermal characteristics. The hybrid thermal model is capable of reflecting the real thermal characteristic of the motor under protection. With the learned parameters for the hybrid thermal model from the rotor resistance estimation, it is capable of protecting an individual motor in an improved manner, reducing unnecessary down time due to spurious tripping.

One embodiment of the invention provides an improved on-line system for estimating the rotor resistance of an induction motor by estimating motor inductances from the stator resistance and samples of the motor terminal voltage and current; and estimating the rotor resistance from samples of the motor terminal voltage and current, the angular speed of the rotor, and the estimated inductances. The voltage and current samples are used to compute the positive sequence, fundamental components of voltage and current. A preferred algorithm computes the ratio of rotor resistance to slip, in terms of the positive sequence voltage and current components and the motor inductances, and multiplies the ratio by the slip to obtain rotor resistance. The rotor temperature is estimated from the estimated rotor resistance.

One embodiment of the invention provides an improved method of estimating the motor inductances from the stator resistance and said samples of the motor terminal voltage and current. The voltage and current samples are taken at at least two different load points, and used to compute the positive sequence, fundamental components of voltage and current. The motor inductances that can be estimated include the stator leakage inductance, the rotor leakage inductance and the mutual inductance of the induction motor, or equivalently, the stator self inductance and the stator transient inductance.

BRIEF DESCRIPTION OF THE DRAWINGS

The foregoing and other advantages of the invention will become apparent upon reading the following detailed description and upon reference to the drawings.

Figure 1A:
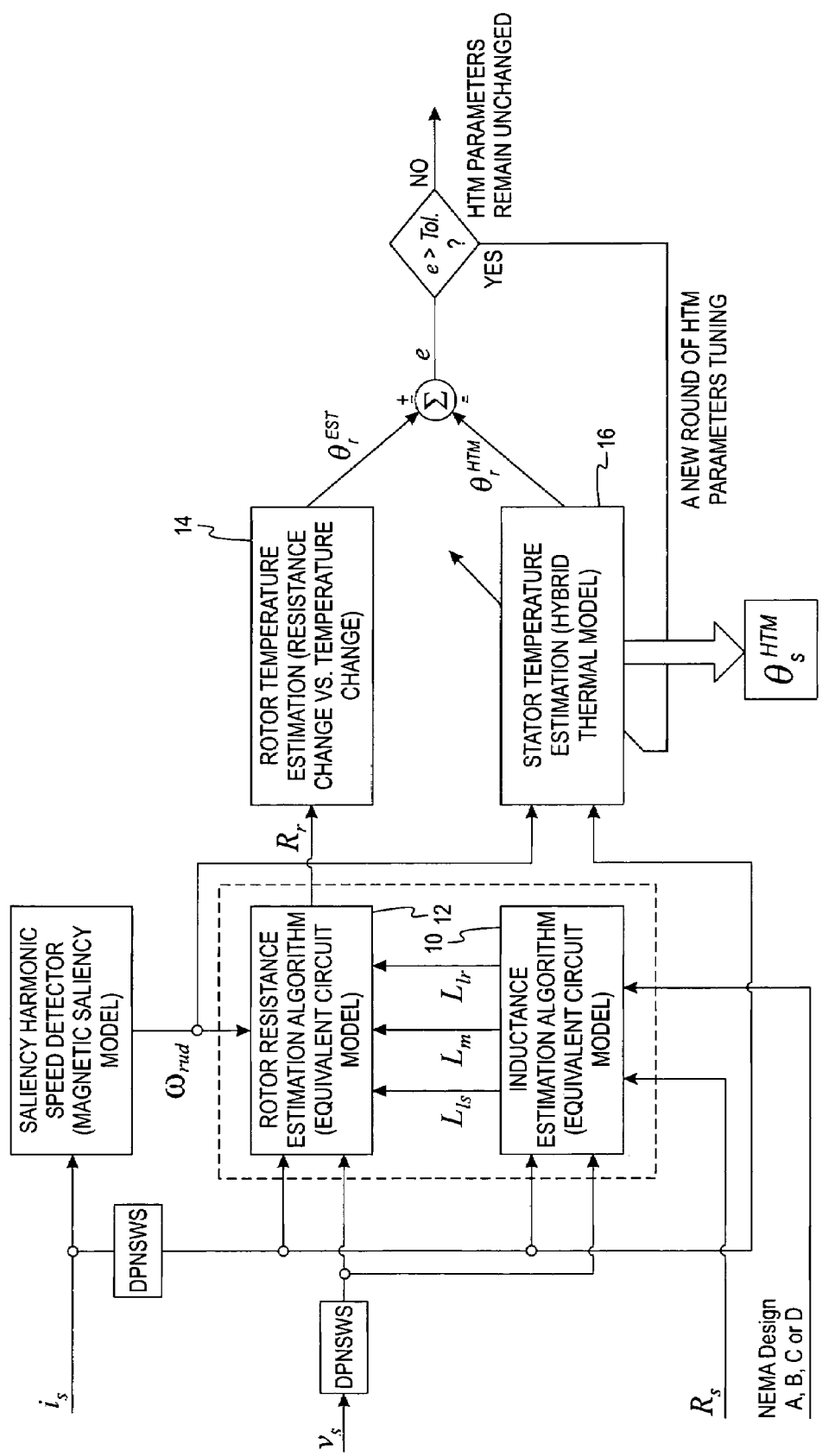
FIGS. 1a and 1b are block diagrams of stator temperature tracking systems for controlling an overload protection relay for an induction motor, in accordance with two alternative embodiments of the invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Figure 1B:
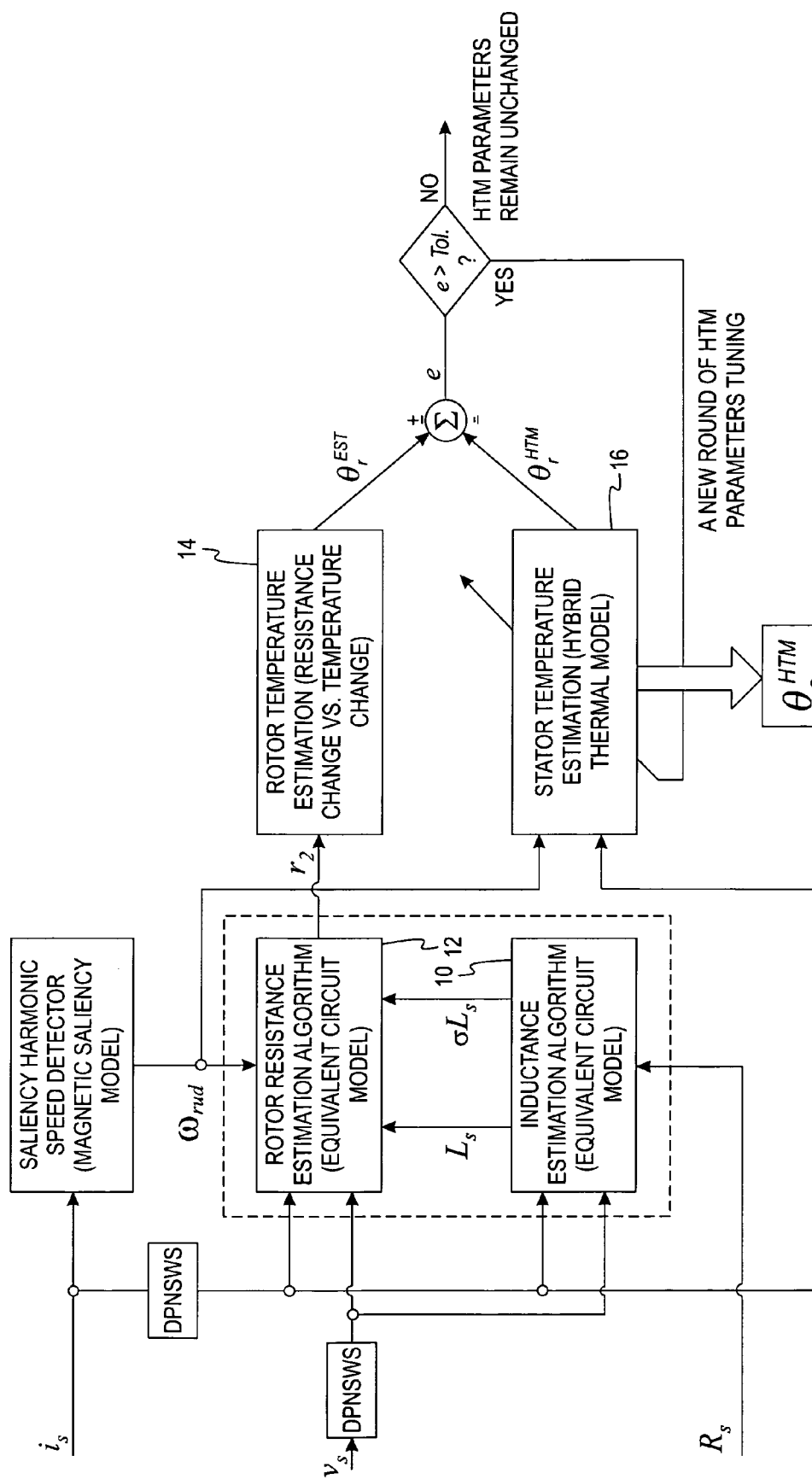

Turning now to the drawings, FIG. 1 illustrates the overall architecture of a system for estimating the stator winding temperature in an induction motor. This estimated temperature can then be used to control the tripping of an electronic relay that protects the motor from overload conditions. The system includes an inductance estimator 10, a rotor resistance estimator 12, a rotor temperature estimator 14, and a stator temperature estimator 16. Online signals supplied to the system include signals $i_s$ and $v_s$ representing samples of the motor terminal current and voltage, respectively, signal $R_S$ representing the resistance of the stator in the motor, and a signal representing the NEMA design A, B, C or D of the motor. The output of the system is a signal $\theta_s^{HTM}$ representing the estimated stator temperature.

The four estimators 10-16 are preferably implemented by a single microprocessor programmed to execute algorithms that calculate the desired estimates based on the input signals and/or the results produced by the estimators. Each of these algorithms will be described in detail below.

The inductance estimator 10 estimates the stator leakage inductance $L_{ls}$, the rotor leakage inductance $L_{lr}$ and the mutual inductance $L_m$ of the motor from the samples $v_s$ and $i_s$ of the motor terminal voltage and current, the stator resistance $R_s$, and the signal representing the NEMA design A, B, C or D. These inductance values are temperature-independent. The inductance estimation algorithm is preferably carried out within one minute from the motor start so that the stator temperature, and hence resistance, are relatively constant.

Figure 2A:
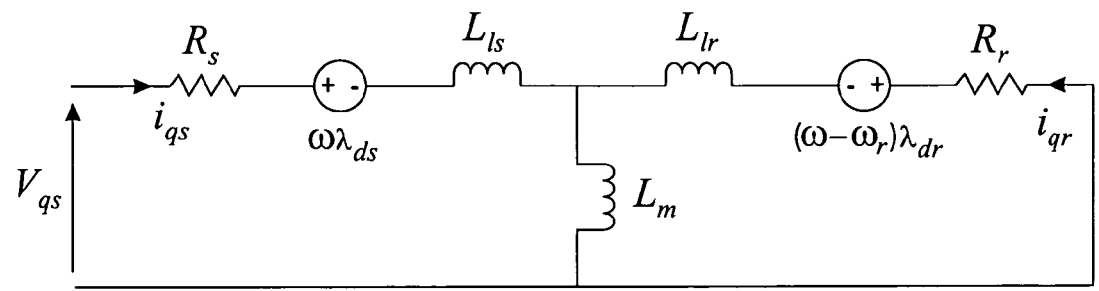
FIGS. 2a and 2b are equivalent circuits of a d-q axis model of a 3-phase induction motor.
Figure 2B:
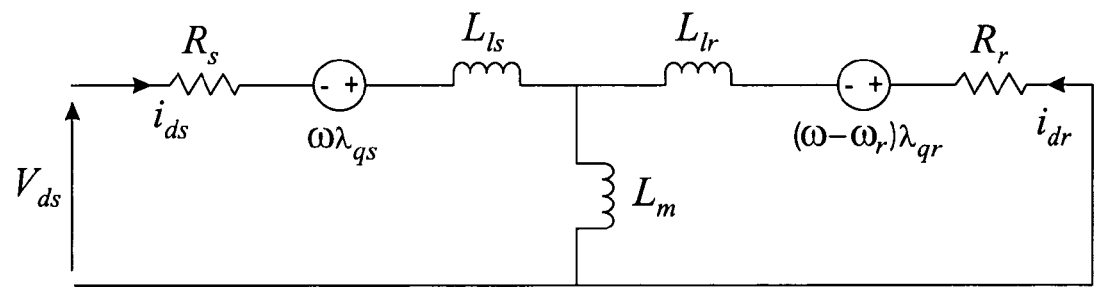

The online inductance estimation is based on the d-q axis dynamic model of a 3-phase induction motor. FIGS. 2*a* and 2*b* are equivalent circuits of the d-q axis model of a 3-phase induction motor where $R_s$ is the stator resistance; $R_r$ is the rotor resistance; $L_{ls}$ is the stator leakage inductance; $L_{lr}$ is the rotor leakage inductance; $L_m$ is the mutual inductance, and $\omega$ is the angular frequency of the reference frame.

Applying the synchronously rotating reference frame to the equivalent circuits shown in FIGS. 2*a* and 2*b* under steady state yields:

$$\begin{bmatrix} V_{ds} \\ V_{qs} \\ V_{dr} \\ V_{qr} \end{bmatrix} = \begin{bmatrix} V_{ds} \\ V_{qs} \\ 0 \\ 0 \end{bmatrix} \qquad (1)$$

$$= \begin{bmatrix} R_s & 0 & 0 & 0 \\ 0 & R_s & 0 & 0 \\ 0 & 0 & R_r & 0 \\ 0 & 0 & 0 & R_r \end{bmatrix} \begin{bmatrix} I_{ds} \\ I_{qs} \\ I_{dr} \\ I_{qr} \end{bmatrix} +$$

$$\begin{bmatrix} 0 & -\omega_e & 0 & 0 \\ \omega_e & 0 & 0 & 0 \\ 0 & 0 & 0 & -s\omega_e \\ 0 & 0 & s\omega_e & 0 \end{bmatrix} \begin{bmatrix} \lambda_{ds} \\ \lambda_{qs} \\ \lambda_{dr} \\ \lambda_{qr} \end{bmatrix}$$

where s is the slip under steady state operation.

The flux and current have the following relationship:

$$\begin{bmatrix} \lambda_{ds} \\ \lambda_{qs} \\ \lambda_{dr} \\ \lambda_{qr} \end{bmatrix} = \begin{bmatrix} L_{ls}+L_m & 0 & L_m & 0 \\ 0 & L_{ls}+L_m & 0 & L_m \\ L_m & 0 & L_{lr}+L_m & 0 \\ 0 & L_m & 0 & L_{lr}+L_m \end{bmatrix} \begin{bmatrix} I_{ds} \\ I_{qs} \\ I_{dr} \\ I_{qr} \end{bmatrix} \qquad (2)$$

Combining Equations (1) and (2) yields:

$$\begin{bmatrix} V_{ds} \\ V_{qs} \\ 0 \\ 0 \end{bmatrix} = \left\{ \begin{bmatrix} R_s & 0 & 0 & 0 \\ 0 & R_s & 0 & 0 \\ 0 & 0 & R_r & 0 \\ 0 & 0 & 0 & R_r \end{bmatrix} + \begin{bmatrix} 0 & -\omega_e & 0 & 0 \\ \omega_e & 0 & 0 & 0 \\ 0 & 0 & 0 & -s\omega_e \\ 0 & 0 & s\omega_e & 0 \end{bmatrix} \right. \qquad (3)$$

$$\left. \begin{bmatrix} L_{ls}+L_m & 0 & L_m & 0 \\ 0 & L_{ls}+L_m & 0 & L_m \\ L_m & 0 & L_{lr}+L_m & 0 \\ 0 & L_m & 0 & L_{lr}+L_m \end{bmatrix} \right\} \begin{bmatrix} I_{ds} \\ I_{qs} \\ I_{dr} \\ I_{qr} \end{bmatrix}$$

Proper simplification of Equation (3) yields:

$$\begin{bmatrix} V_{qs} \\ V_{ds} \\ 0 \\ 0 \end{bmatrix} = \begin{bmatrix} R_s & \omega_e L_s & 0 & \omega_e L_m \\ -\omega_e L_s & R_s & -\omega_e L_m & 0 \\ 0 & s\omega_e L_m & R_r & s\omega_e L_r \\ -s\omega_e L_m & 0 & -s\omega_e L_r & R_r \end{bmatrix} \begin{bmatrix} I_{qs} \\ I_{ds} \\ I_{qr} \\ I_{dr} \end{bmatrix} \qquad (4)$$

where $R_s$ and $R_r$ are the stator and rotor resistances respectively; $L_s$, $L_r$, and $L_m$ are the stator, rotor and mutual inductances, respectively; $\omega_e$ is the angular frequency (rad/s) of the synchronous reference frame; s is the slip; and $s\omega_e$ is the slip frequency.

Aligning the d-axis with the stator current space vector $\vec{i}_s(t)$ yields $I_{ds}=I_s$ and $I_{qs}=0$. Then Equation (4) can be further simplified to:

$$\begin{bmatrix} V_{qs} \\ V_{ds} \\ 0 \\ 0 \end{bmatrix} = \begin{bmatrix} \omega_e L_s & 0 & \omega_e L_m \\ R_s & -\omega_e L_m & 0 \\ s\omega_e L_m & R_r & s\omega_e L_r \\ 0 & -s\omega_e L_r & R_r \end{bmatrix} \begin{bmatrix} I_s \\ I_{qr} \\ I_{dr} \end{bmatrix} \quad (5)$$

Defining $$V_s \equiv \sqrt{V_{qs}^2 + V_{ds}^2}, \sigma = 1 - \frac{L_m^2}{L_s L_r},$$

and using Equation (5), gives the following relationship:

$$V_s^2 + I_s^2 R_s^2 - 2R_s V_{ds} I_s = (1+\sigma)L_s \omega_e I_s V_{qs} - \sigma L_s^2 \omega_e^2 I_s^2 \quad (6)$$

A compact form of Equation (6) is given by:

$$y = \theta^T u = u^T \theta \quad (7)$$

where $y = V_s^2 + I_s^2 R_s^2 - 2R_s V_{ds} I_s$, $\theta = [(1+\sigma)L_s \ \sigma L_s^2]^T$ and $u = [\omega_e I_s V_{qs} \ -\omega_e^2 I_s^2]^T$.

The values of y and u depend on the operating point of the motor. For a given motor, different load levels lead to different values of u.

Because the parameter vector θ is composed solely of the motor inductance values, parametric estimation of the vector θ can be carried out by measuring the voltage and current at different load levels.

With recorded voltage and current data at n operating points, the following vectors can be formed:

$$y = \begin{bmatrix} y_1 \\ y_2 \\ \vdots \\ y_n \end{bmatrix}, U = \begin{bmatrix} u_1^T \\ u_2^T \\ \vdots \\ u_n^T \end{bmatrix}$$

Then Equation (8) can be expressed as:

$$\begin{bmatrix} y_1 \\ y_2 \\ \vdots \\ y_n \end{bmatrix} = \begin{bmatrix} u_1^T \theta \\ u_2^T \theta \\ \vdots \\ u_n^T \theta \end{bmatrix} \Rightarrow \begin{bmatrix} y_1 \\ y_2 \\ \vdots \\ y_n \end{bmatrix} = \begin{bmatrix} u_1^T \\ u_2^T \\ \vdots \\ u_n^T \end{bmatrix} \theta \Rightarrow y = U\theta \quad (8)$$

If n>2 then matrix U is not square. To determine the corresponding parameter vector θ, the Moore-Penrose inverse of U, which is designated by $U^\dagger$, can be taken. For a non-square matrix, the Moore-Penrose inverse is not only a good analogy to the conventional inverse of the square matrix, but also a minimum norm least square solution with superb stability to the simultaneous linear Equation (8) under small signal perturbation.

Having obtained the Moore-Penrose inverse of U, the solution to Equation (8) can then be written as:

$$\theta = U^\dagger y \quad (9)$$

Once the parameter vector $\theta = [\theta_1 \ \theta_2]^T = [(1+\sigma)L_s \ \sigma L_s^2]^T$ is determined, the value of $L_s$ and $\sigma L_s$ can be attained by solving the following second-order polynomial equation:

$$x^2 - \theta_1 x + \theta_2 = 0 \quad (10)$$

Assuming the roots of Equation (10) are $x_1$ and $x_2$, with $x_1 > x_2$, gives:

$$\begin{cases} x_1 = L_s = L_{ls} + L_m \\ x_2 = \sigma L_s = L_s - \frac{L_m^2}{L_r} = L_{ls} + L_m - \frac{L_m^2}{L_{lr} + L_m} \end{cases} \quad (11)$$

From *IEEE Standard Test Procedure for Polyphase Induction Motors and Generators*, IEEE Standard 112-1996, September 1996, the ratio between the leakage inductances is obtained for motors with different NEMA designs, $$\frac{L_{lr}}{L_{ls}} = \gamma.$$

The mutual inductance $L_m$ is then the positive root of the following quadratic equation:

$$L_m^2 + (\gamma - 1)(x_1 - x_2)L_m - \gamma x_1(x_1 - x_2) = 0 \quad (12)$$

where $x_1$ and $x_2$ are the roots of equation (10).

Once the mutual inductance $L_m$ is found, the stator leakage inductance can be acquired by:

$$L_{ls} = L_s - L_m = x_1 - L_m \quad (13)$$

And the rotor leakage inductance is:

$$L_{lr} = \gamma L_{ls} \quad (14)$$

Figure 3A:
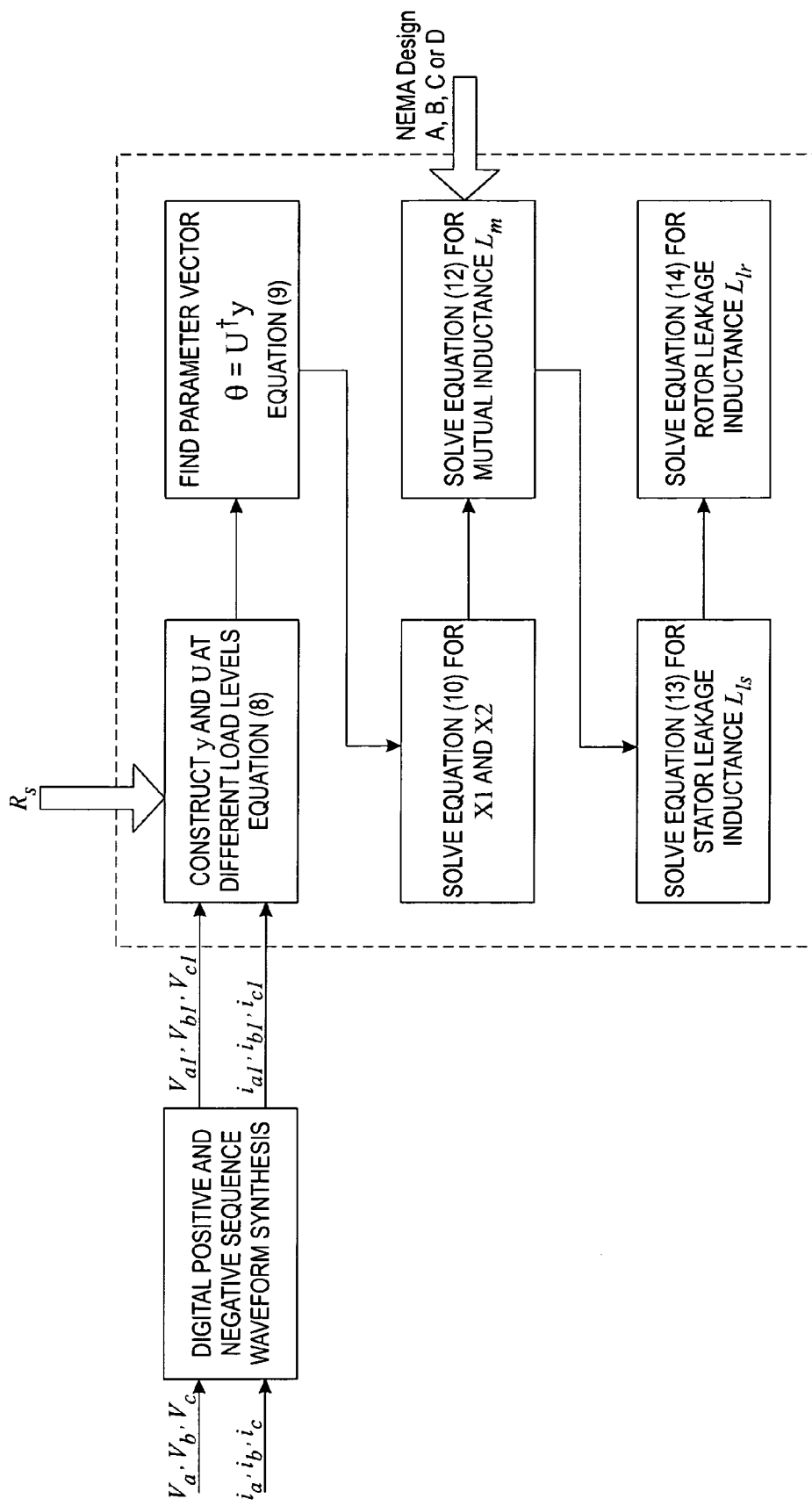
FIGS. 3a and 3b are flowcharts of online inductance estimation algorithms suitable for use in the systems of FIGS. 1a and 1b, respectively.
Figure 3B:
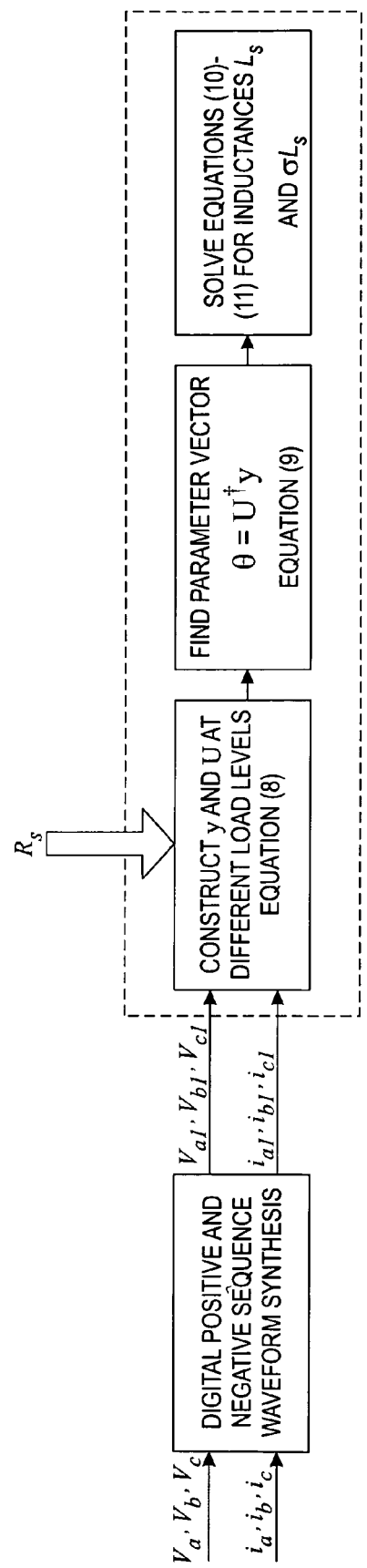

FIG. 3 is a flow chart for the inductance estimation algorithm. Sensors are needed to collect voltage and current information $v_a$, $v_b$, $v_c$ and $i_a$, $i_b$, $i_c$, which is conventional for many motor applications.

The inductance estimation algorithm requires the cold state (ambient temperature) stator resistance $R_s$ as its input, as illustrated in FIG. 3. This stator resistance is usually provided by the motor manufacturer. If it is not, a simple direct current injection test can determine the precise value of the cold state stator resistance. In some cases, a multimeter can establish the resistance value with reasonable accuracy.

The other input needed is the machine design: NEMA A, B, C or D, which is normally printed on the motor's nameplate. This is used to determine the ratio γ between the stator leakage inductance and the rotor leakage inductance.

The online inductance estimation algorithm is based on the equations for steady state motor operation, and thus is not run during the transient state. As can be seen in FIG. 3, the algorithm executes Equations (8), (9), (10), (12), (13) and (14) sequentially.

Multiple runs at different load levels are used to construct the matrices y and U. They should be of appropriate dimensions to permit estimation of the motor parameter vector θ. Most mains-fed motors have a working cycle of starting—accelerating—running—stopped. The online inductance estimation algorithm enables the overload relay to learn the motor parameters during the first several such working cycles. After the successful recognition of those machine parameters, the electrical model of the induction machine is then properly tuned for the rotor resistance estimation algorithm. At this moment, the inductance estimation algorithm has accomplished its design objective and can therefore be safely bypassed.

Figure 4:
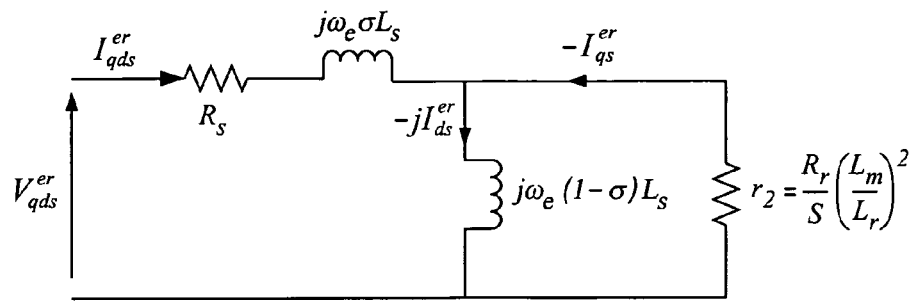
FIG. 4 is a steady-state equivalent circuit of an induction motor.

The motor inductances may also be estimated from phasor analysis of the steady-state equivalent circuit illustrated in FIG. 4. To eliminate the stator resistance from the circuit equations, as illustrated in the modified block diagrams in FIGS. 1b and 3b. Expressions relating $V_s$, $I_s$, $r_1$, $L_s$, $\sigma$ may be derived as follows:

In FIG. 4, the stator self inductance is $L_s = L_{ls} + L_m$; the rotor self inductance is $$L_r = L_{lr} + L_m; \sigma = 1 - \frac{L_m^2}{L_s L_r};$$

s is the slip; $\omega_e$ is the angular speed, in rad/s, of the synchronously rotating reference frame; $V_{qds}{}^{er}$ and $I_{qds}{}^{er}$ are the stator voltage and current space vectors under the synchronously rotating reference frame, respectively; $I_{qs}{}^{er}$ and $I_{ds}{}^{er}$ are the stator current space vectors along the q-axis and d-axis, respectively.

From the complex vector analysis, the voltage and current space vectors, $V_{qds}{}^{er}$ and $I_{qds}{}^{er}$, are regarded as $\tilde{V}_s$ and $\tilde{I}_s$ rotating in space. Hence phasors can also be used in FIG. 4 to represent the steady state motor operation.

Figure 5:
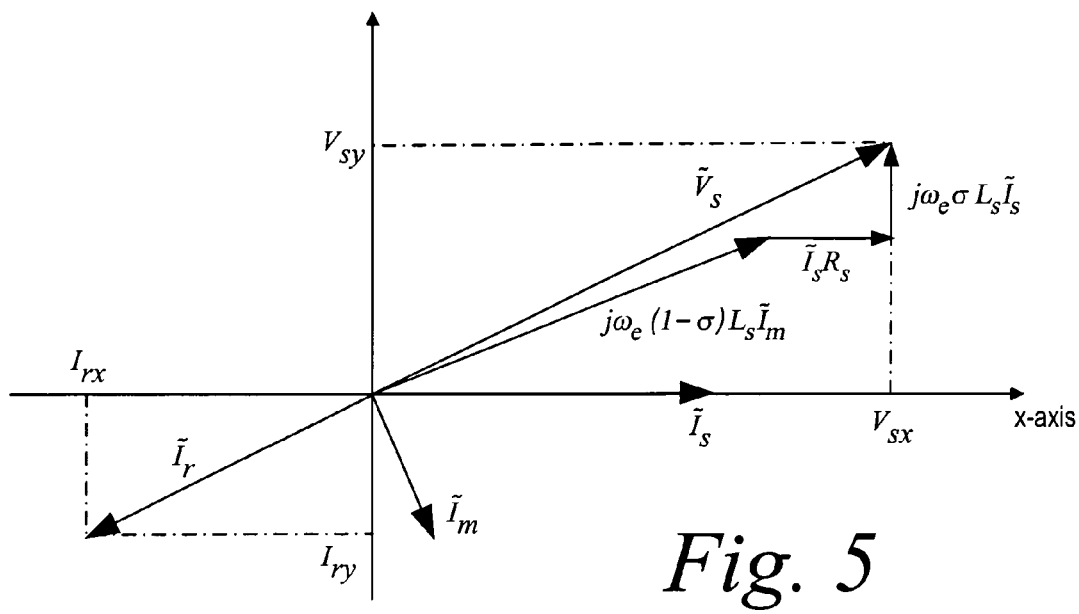
FIG. 5 is a phasor diagram for the equivalent circuit of FIG. 4.

Let $\tilde{I}_r$ and $\tilde{I}_m$ denote the phasors corresponding to $-I_{qs}{}^{er}$ and $-jI_{ds}{}^{er}$, respectively. By aligning the x-axis with $\tilde{I}_s$, the abscissa and ordinate of a plane Cartesian coordinate are completely determined in the phasor diagram depicted in FIG. 5. Let $V_{sx}$ and $V_{sy}$ denote the projection of $\tilde{V}_s$ onto the x-axis and y-axis, and similarly $I_{rx}$ and $I_{ry}$ for $\tilde{I}_r$, then:

$$\begin{bmatrix} V_{sy} \\ V_{sx} \\ 0 \\ 0 \end{bmatrix} = \begin{bmatrix} \omega_e L_s & 0 & \omega_e(1-\sigma)L_s \\ R_s & -\omega_e(1-\sigma)L_s & 0 \\ \omega_e(1-\sigma)L_s & r_2 & \omega_e(1-\sigma)L_s \\ 0 & -\omega_e(1-\sigma)L_s & r_2 \end{bmatrix} \begin{bmatrix} I_s \\ I_{ry} \\ I_{rx} \end{bmatrix} \quad (15)$$

Eliminating $I_{rx}$ and $I_{ry}$ from the first two rows, eliminating $r_2$ from the last row, and substituting those relationships into the third row yields, after proper rearrangement:

$$[\omega_e I_s V_{sy} \quad -\omega_e^2 I_s^2] \begin{bmatrix} (1+\sigma)L_s \\ \sigma L_s^2 \end{bmatrix} = V_s^2 + I_s^2 R_s^2 - 2 R_s I_s V_{sx} \quad (16)$$

By taking the voltage and current measurements at two different load levels, the induction machine parameter vector $[(1+\sigma)L_s \; \sigma L_s^2]^T$ is solved for motor inductances, $L_s$ and $\sigma L_s$ as described above.

Since the motor inductance estimation algorithm is essentially based on the fundamental frequency positive sequence machine model, other components in the voltage and current samples should be eliminated. The digital positive waveform synthesis is designed for such purpose. By extracting positive sequence instantaneous values $v_{a1}$, $v_{b1}$, $v_{c1}$ or $i_{a1}$, $i_{b1}$, $i_{c1}$ from the original sampled data $v_a$, $v_b$, $v_c$ or $i_a$, $i_b$, $i_c$, filtered data can be acquired for the estimation algorithm.

The most important aspect of digital positive and negative sequence waveform synthesis is the digital phasor extraction. Its purpose is to extract from the instantaneous voltage and current data the corresponding phasors under sinusoidal steady state condition. Its theory of operation is detailed below.

Starting from the basic concept, a periodic impulse train is described by:

$$\tilde{x}[n] = \sum_{i=0}^{N-1} \delta[n-i]. \quad (17)$$

The discrete Fourier series of this impulse train is:

$$\tilde{X}[k] = \sum_{n=0}^{N-1} W_N^{kn}. \quad (18)$$

where $$W_N = e^{-j\frac{2\pi}{N}}.$$

When $k \neq 0$, the discrete Fourier series in Equation (18) is simplified to:

$$\tilde{X}[k] = \sum_{n=0}^{N-1} W_N^{kn} = \sum_{n=0}^{N-1} e^{-jk\frac{2\pi n}{N}} = \frac{1 - e^{-jk\frac{2\pi N}{N}}}{1 - e^{-j\frac{2\pi}{N}}} = 0 \quad (19)$$

The real part of Equation (19) is:

$$\operatorname{Re}\{\tilde{X}[k]\} = \operatorname{Re}\left\{\sum_{n=0}^{N-1} e^{-jk\frac{2\pi n}{N}}\right\} = \sum_{n=0}^{N-1} \cos\left(k\frac{2\pi n}{N}\right) = 0 \quad (20)$$

Similarly, the imaginary part of Equation (19) is:

$$\operatorname{Im}\{\tilde{X}[k]\} = \operatorname{Im}\left\{\sum_{n=0}^{N-1} e^{-jk\frac{2\pi n}{N}}\right\} = \sum_{n=0}^{N-1} \sin\left(k\frac{2\pi n}{N}\right) = 0 \quad (21)$$

If the frequency of the power supply is $f_e$, then the angular frequency of the power supply is $\omega_e = 2\pi f_e$, and the period is $$T_e = \frac{1}{f_e}.$$

In each cycle N samples of the voltage and current signals are taken.

If $t_n$ is the corresponding time for the $n^{th}$ sample, $$t_n = \frac{n}{N} \cdot T_e.$$

So from Equation (20) and Equation (21), it is known that:

$$\sum_{n=0}^{N-1} [\sin(p\omega_e t_n)\sin(q\omega_e t_n)] = \quad (22)$$

$$\sum_{n=0}^{N-1} \left\{ \frac{1}{2}\cos[(p-q)\omega_e t_n] - \frac{1}{2}\cos[(p+q)\omega_e t_n] \right\} =$$

$$\frac{1}{2}\sum_{n=0}^{N-1} \cos\left[(p-q)\frac{2\pi n}{N}\right] - \frac{1}{2}\sum_{n=0}^{N-1} \cos\left[(p+q)\frac{2\pi n}{N}\right]$$

$$\sum_{n=0}^{N-1} [\sin(p\omega_e t_n)\cos(q\omega_e t_n)] = \quad (23)$$

$$\sum_{n=0}^{N-1} \left\{ \frac{1}{2}\sin[(p+q)\omega_e t_n] + \frac{1}{2}\sin[(p-q)\omega_e t_n] \right\} =$$

$$\frac{1}{2}\sum_{n=0}^{N-1} \sin\left[(p+q)\frac{2\pi n}{N}\right] + \frac{1}{2}\sum_{n=0}^{N-1} \sin\left[(p-q)\frac{2\pi n}{N}\right]$$

$$\sum_{n=0}^{N-1} [\cos(p\omega_e t_n)\sin(q\omega_e t_n)] = \quad (24)$$

$$\sum_{n=0}^{N-1} \left\{ \frac{1}{2}\sin[(p+q)\omega_e t_n] - \frac{1}{2}\sin[(p-q)\omega_e t_n] \right\} =$$

$$\frac{1}{2}\sum_{n=0}^{N-1} \sin\left[(p+q)\frac{2\pi n}{N}\right] - \frac{1}{2}\sum_{n=0}^{N-1} \sin\left[(p-q)\frac{2\pi n}{N}\right]$$

$$\sum_{n=0}^{N-1} [\cos(p\omega_e t_n)\cos(q\omega_e t_n)] = \quad (25)$$

$$\sum_{n=0}^{N-1} \left\{ \frac{1}{2}\cos[(p+q)\omega_e t_n] + \frac{1}{2}\cos[(p-q)\omega_e t_n] \right\} =$$

$$\frac{1}{2}\sum_{n=0}^{N-1} \cos\left[(p+q)\frac{2\pi n}{N}\right] + \frac{1}{2}\sum_{n=0}^{N-1} \cos\left[(p-q)\frac{2\pi n}{N}\right]$$

where p and q are positive integers. From Equations (20)-(21), Equations (22)-(25) are all zero, unless $p\pm q=0$.

Typical voltage or current waveforms with fundamental frequency $f_e$ can be described by:

$$f(t) = \frac{1}{2}a_0 + \sum_{h=1}^{\infty} [a_h \cos(h\omega_e t) + b_h \sin(h\omega_e t)] \quad (26)$$

where $a_1$ and $b_1$ are constant coefficients for fundamental frequency components, and $a_h$ and $b_h$ (h>2) are coefficients for harmonic content in the waveform.

Based on Equations (22) through (25), the following Equations (27) through (28) can be employed to determine the constant coefficients $a_1$ and $b_1$ in the voltage or current waveform f(t):

$$a_1 = \frac{2}{N}\sum_{n=0}^{N-1} [f(t_n) \cdot \cos(\omega_e t_n)] \quad (27)$$

$$b_1 = \frac{2}{N}\sum_{n=0}^{N-1} [f(t_n) \cdot \sin(\omega_e t_n)] \quad (28)$$

Once the coefficients, $a_1$ and $b_1$, in the fundamental component of the instantaneous voltage, $v(t)=a_1 \cos(\omega_e t)+b_1 \sin(\omega_e t)$, are known from Equations (27) and (28), the corresponding voltage phasor, $$\tilde{V} = \sqrt{\frac{a_1^2 + b_1^2}{2}} \cdot e^{-j\varphi}$$

can be calculated.

$$\varphi = \begin{cases} \arctan\left(\frac{b_1}{a_1}\right) & a_1 > 0 \\ \pm\frac{\pi}{2} & a_1 = 0 \\ \arctan\left(\frac{b_1}{a_1}\right)+\pi & a_1 < 0 \end{cases} \quad (29)$$

Figure 6:
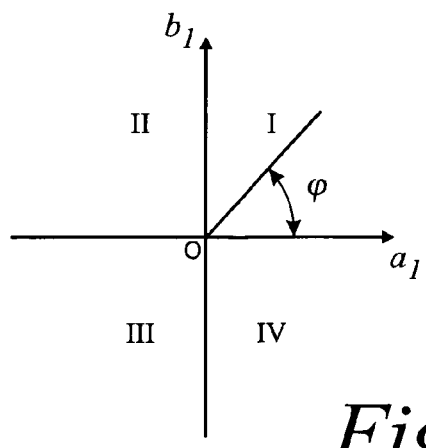
FIG. 6 is a graph depicting the relationship among three parameters used in one implementation of the system illustrated in FIG. 1.

FIG. 6 can be used as an aid in determining the angle φ from Equation (29). When the point $(a_1, b_1)$ is in Quadrants I and IV, $$\varphi = \arctan\left(\frac{b_1}{a_1}\right);$$

when point $(a_1, b_1)$ is in Quadrants I and III, $$\varphi = \arctan\left(\frac{b_1}{a_1}\right)+\pi;$$

when point $(a_1, b_1)$ is on the vertical axis, $$\varphi = \frac{\pi}{2}$$

for $b_1>0$ and $$\varphi = -\frac{\pi}{2}$$

for $b_1<0$.

After extracting the phasors from the instantaneous values, the second step is to use a symmetric components method to decompose them into positive and negative sequence components for future analysis.

Denoting $a=e^{j120°}$ yields:

$$\begin{bmatrix} \tilde{V}_1 \\ \tilde{V}_2 \\ \tilde{V}_0 \end{bmatrix} = \frac{1}{3}\begin{bmatrix} 1 & a & a^2 \\ 1 & a^2 & a \\ 1 & 1 & 1 \end{bmatrix}\begin{bmatrix} \tilde{V}_a \\ \tilde{V}_b \\ \tilde{V}_c \end{bmatrix} \quad (30)$$

By decomposing the voltage and current information into positive and negative sequence components, further analysis can be done on the machine's sequence model.

Once the positive sequence phasors are computed, the corresponding instantaneous values for each individual phase can be obtained by the following mapping:

$$\tilde{V}_1 = V_1 e^{j\phi} \Rightarrow \begin{cases} \tilde{v}_a = \tilde{V}_1 & \Leftrightarrow & v_a = \sqrt{2}\,V_1\cos(\omega_e t + \phi) \\ \tilde{v}_b = \tilde{V}_1 e^{-j120°} & \Leftrightarrow & v_b = \sqrt{2}\,V_1\cos(\omega_e t + \phi - 120°) \\ \tilde{v}_c = \tilde{V}_1 e^{j120°} & \Leftrightarrow & v_c = \sqrt{2}\,V_1\cos(\omega_e t + \phi + 120°) \end{cases} \quad (31)$$

The rotor resistance estimator 12 estimates the rotor resistance based on the estimated inductances of the motor, the samples $v_s$ and $i_s$ of the motor terminal voltage and current, and the angular speed $\omega_{rud}$ of the rotor. The rotor resistance value is temperature-dependent.

The digital positive sequence waveform synthesizer (DPSWS) block is also used in the rotor resistance estimation algorithm to filter out the negative sequence components and harmonics to insure a reliable estimate of the rotor resistance.

Rotor speed can be obtained, for example, from a saliency harmonic speed detection algorithm based on K. D. Hurst and T. G. Habetler, "A Comparison of Spectrum Estimation Techniques for Sensorless Speed Detection in Induction Machines," *IEEE Transactions on Industry Applications*, Vol. 33, No. 4 July/August 1997, pp. 898-905.

Using a synchronously rotating reference frame, the operation of a symmetrical induction machine can be described by the following set of equations:

$$\begin{bmatrix} v_{qs} \\ v_{ds} \\ v_{qr} \\ v_{dr} \end{bmatrix} = \begin{bmatrix} R_s + pL_s & \omega_e L_s & pL_m & \omega_e L_m \\ -\omega_e L_s & R_s + pL_s & -\omega_e L_m & pL_m \\ pL_m & s\omega_e L_m & R_r + pL_r & s\omega_e L_r \\ -s\omega_e L_m & pL_m & -s\omega_e L_r & R_r + pL_r \end{bmatrix} \begin{bmatrix} i_{qs} \\ i_{ds} \\ i_{qr} \\ i_{dr} \end{bmatrix} \quad (32)$$

where $R_s$ and $R_r$ are the stator and rotor resistance respectively; $L_s$, $L_r$ and $L_m$ are the stator, rotor and mutual inductance respectively; $\omega_e$ is the angular frequency (rad/s) of the synchronous reference frame; s is the slip; and p is the differential operator $$\frac{d}{dt}.$$

Aligning the d-axis with the stator current vector $\vec{i}_s(t)$ and assuming steady state operation so that p=0, Equation (32) can be simplified to:

$$\begin{bmatrix} V_{qs} \\ 0 \\ 0 \end{bmatrix} = \begin{bmatrix} \omega_e L_s & 0 & \omega_e L_m \\ s\omega_e L_m & R_r & s\omega_e L_r \\ 0 & -s\omega_e L_r & R_r \end{bmatrix} \begin{bmatrix} I_s \\ I_{qr} \\ I_{dr} \end{bmatrix} \quad (33)$$

Solving Equation (33) for $R_r$ gives:

$$R_r = s\omega_e \sqrt{L_r\left(\frac{\omega_e L_m^2}{\omega_e L_s - \frac{V_{qs}}{I_s}} - L_r\right)} \quad (34)$$

Equation (34) is the primary equation used for rotor resistance estimation. Since it requires only inductances $L_s$, $L_r$ and $L_m$; voltage, $V_{qs}$; current, $I_s$ and slip frequency, $s\omega_e$, the outcome gives an accurate estimate of rotor resistance. This rotor resistance estimate is independent of the stator resistance and hence the stator winding temperature.

The rotor resistance may also be estimated from phasor analysis of the steady-state equivalent circuit illustrated in FIG. 4.

First, the last two rows in Equation (15) are solved for $I_{rx}$ and $I_{ry}$:

$$\begin{bmatrix} I_{rx} \\ I_{ry} \end{bmatrix} = \frac{-I_s}{r_2^2 + \omega_e^2(1-\sigma)^2 L_s^2} \begin{bmatrix} \omega_e^2(1-\sigma)^2 L_s^2 \\ \omega_e(1-\sigma)L_s r_2 \end{bmatrix} \quad (35)$$

Substituting $I_{rx}$ in the first row of Equation (15), solving for $r_2$ and using the notational definition $r_2 = R_r/s(L_m/L_r)^2$, gives:

$$R_r\left(\frac{L_m}{L_r}\right)^2 = s\omega_e(1-\sigma)L_s \sqrt{\frac{\frac{V_{sy}}{I_s} - \omega_e\sigma L_s}{\omega_e L_s - \frac{V_{sy}}{I_s}}} \quad (36)$$

The rotor temperature estimator 14 estimates the rotor temperature or $\theta_r^{EST}$ from the estimated rotor resistance and the well known linear relationship between the rotor temperature and rotor resistance.

Figure 7:
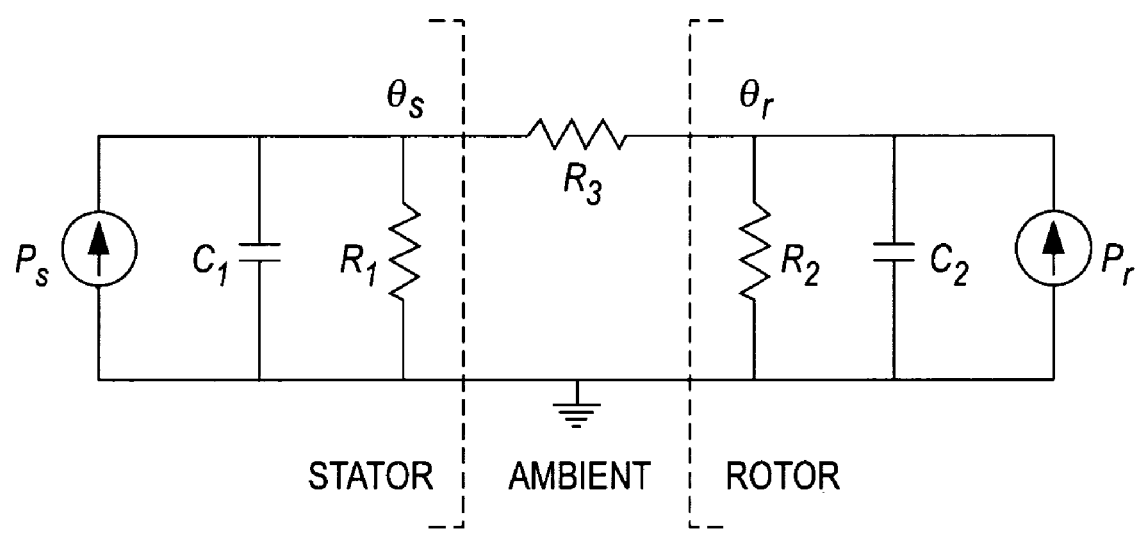
FIG. 7 is a flow chart of of an online parameter tuning algorithm for a hybrid thermal model.

The stator temperature estimator 16 estimates the stator temperature of an induction machine from its rotor angular speed $\omega_{rud}$, the stator current $i_s$ and the estimated rotor temperature $\theta_r^{EST}$, using a full-order hybrid thermal model (HTM) illustrated in FIG. 7. The HTM approximates the rotor and stator thermal characteristics. The model parameters are loosely associated with aspects of the machine design.

The quantities $\theta_s$ and $\theta_r$ are temperature rises [° C.] above ambient on the stator and rotor sides, respectively. The power input $P_s$ [W] is associated directly with the $I^2R$ loss generated in the stator winding. In addition, under constant supply voltage, the core loss generated in the stator teeth and the back iron contributes a fixed portion to the rise of $\theta_s$. The power input $P_r$ is associated mainly with the $I^2R$ loss in the rotor bars and end rings. These losses are calculated from the induction machine equivalent circuit.

The thermal resistance $R_1$ [° C./W] represents the heat dissipation capability of the stator to the ambient through the combined effects of heat conduction and convection; the thermal resistance $R_2$ [° C./W] is associated with the heat dissipation capability of the rotor to its surroundings; the thermal resistance $R_3$ [° C./W] is associated with the heat transfer from the rotor to the stator across the air gap. Since the radiation only accounts for a small amount of energy dissipated for most induction machines, its effect can be safely ignored without introducing significant errors in the stator winding temperature estimation.

The thermal capacitances $C_1$ and $C_2$ [J/° C.] are defined to be the energy needed to elevate the temperature by one degree Celsius for the stator and rotor, respectively. The capacitance $C_1$ represents the total thermal capacity of the stator windings, iron core and frame, while $C_2$ represents the combined thermal capacity of the rotor conductors, rotor core and shaft.

A motor's stator and rotor thermal capacitances $C_1$ and $C_2$ are fixed once the motor is manufactured. The motor's thermal resistances, however, are largely determined by its working environment. When a motor experiences an impaired cooling condition, $R_1$, $R_2$ and $R_3$ vary accordingly to reflect the changes in the stator and rotor thermal characteristics.

The thermal characteristics of a motor manifest themselves in the rotor temperature, which can be observed from the rotor temperature via the embodiment of the rotor resistance estimator. Based on the estimated rotor temperature, the parameters of the HTM can therefore be adapted in an online fashion to reflect the motor's true cooling capability.

Compared with the conventional thermal model using a single thermal capacitor and a single thermal resistor, the HTM incorporates the rotor losses and the heat transfer between the rotor and the stator. When properly turned to a specific motor's cooling capacity, it is capable of tracking the stator winding temperature during running overloads, and therefore provides adequate protection against overheating. Furthermore, the HTM is of adequate complexity compared to more complex thermal networks. This makes it suitable for online parameter tuning.

For most TEFC machines up to 100 hp, $C_1$ is usually larger than $C_2$ due to the design of the motor. $R_1$ is typically smaller than $R_2$ because of the superior heat dissipation capacity of the stator. $R_3$ is usually of the same order of magnitude as $R_1$, and it correlates the rotor temperature to the stator temperature. These relationships are justified by the detailed analysis of the machine design.

Some TEFC motors are even equipped with pin-type cooling fins on the surface of the frame, which makes it easier for the heat to be evacuated to the ambient. $R_2$ is usually 4-30 times larger than $R_1$ at rated conditions.

3) Relationship between $R_1$ and $R_3$: Most induction machines with TEFC design in the low power range are characterized by a small air gap (typically around 0.25-0.75 mm) to increase efficiency. Furthermore, only a limited amount of air is exchanged between the inside and outside of the motor due to the enclosure. Therefore, among the rotor cage losses that are dissipated through the air gap, a significant portion is transferred to the stator by means of laminar heat flow, while the rest is passed to the endcap air inside the motor. These rotor cage losses, combined with the stator losses, travel through the stator frame and end shield and finally reach the ambient. Hence, the rotor and stator temperatures are highly correlated due to this heat flow pattern.

It has been estimated that 65% of the overall rotor losses are dissipated through the air gap at rated condition. This indicates that $R_3$ is much smaller than $R_2$, and is usually of the same order of magnitude as $R_1$. Otherwise, the rotor losses would be dissipated mainly along the shaft instead of through the air gap.

Assuming $P_s$ and $P_r$ are the inputs and $\theta_r$ is the output, the state space equations that describe the hybrid thermal model in FIG. 7 are:

$$\begin{bmatrix} \dot{\theta}_s \\ \dot{\theta}_r \end{bmatrix} = \begin{bmatrix} -\frac{1}{C_1}\left(\frac{1}{R_1} + \frac{1}{R_3}\right) & \frac{1}{R_3 C_1} \\ \frac{1}{R_3 C_2} & -\frac{1}{C_2}\left(\frac{1}{R_2} + \frac{1}{R_3}\right) \end{bmatrix} \begin{bmatrix} \theta_s \\ \theta_r \end{bmatrix} + \begin{bmatrix} \frac{1}{C_1} & 0 \\ 0 & \frac{1}{C_2} \end{bmatrix} \begin{bmatrix} P_s \\ P_r \end{bmatrix} \qquad (37)$$

$$y = \begin{bmatrix} 0 & 1 \end{bmatrix} \begin{bmatrix} \theta_s \\ \theta_r \end{bmatrix} \qquad (38)$$

1) Relationship between $C_1$ and $C_2$: For most small-size induction machines with the TEFC design, the frame is an integral part of the machine. The frame acts as a heat sink with a large thermal capacitance. Therefore, even thought the bulk parts of both the stator and rotor are laminated silicon steel of the same axial length, the thermal capacitance $C_1$ is often larger than $C_2$ due to the inclusion of the frame. In addition, the stator winding overhang provides some extra thermal capacity to $C_1$. Normally, $C_1$ is 2 to 3 times larger than $C_2$.

2) Relationship between $R_1$ and $R_2$: The frame of a small-size TEFC motor prevents the free exchange of air between the inside and outside of the case. Consequently, the heat transfer by means of convection from the rotor to the external ambient is restricted at all conditions. Only a limited amount of heat created by the rotor is transferred by means of conduction from the rotor bars and the end rings through the rotor iron to the shaft, and then flows axially along the shaft, through the bearings to the frame and finally reaches the ambient. In contrast, the stator dissipates heat effectively through the combined effects of conduction and convection. The axial ventilation through the air gap carries part of the heat away from the stator slot winding and the stator teeth, with the balance of the heat transferred radially through the stator iron and frame to the external ambient.

As evidence of the good thermal conductivities of the stator iron and frame, the temperature of the stator slot winding is usually 5-10° C. lower than that of the stator end winding.

Since the magnitude of the core loss is independent of the motor load level under constant supply voltage, and the core loss is far less than the stator $I^2R$ loss for most modern induction machines, it is therefore neglected in $P_s$. By taking into account only the $I^2R$ losses in the stator and rotor, $P_s$ and $P_r$ are:

$$P_s = 3 I_s^2 R_s \qquad (39)$$

$$P_r = 3 I_s^2 \frac{s^2 \omega_e^2 L_m^2}{R_r^2 + s^2 \omega_e^2 L_r^2} R_r \qquad (40)$$

where $I_s$ is the stator rms current; $R_s$ and $R_r$ are the stator and rotor resistances, respectively; $L_m$ and $L_r$ are the mutual and rotor inductances, respectively; s is the per unit slip; and $\omega_e$ is the synchronous speed.

K is the ratio of $P_r$ to $P_s$:

$$K = \frac{P_r}{P_s} = \frac{s^2 \omega_e^2 L_m^2}{R_r^2 + s^2 \omega_e^2 L_r^2} \cdot \frac{R_r}{R_s} \qquad (41)$$

Since the temperature increases gradually inside the motor at running overload conditions, K remains constant if the rotor speed does not change.

By substituting $P_r$ with $KP_s$ in Equation (37) and taking the Laplace transform, the transfer function between the input $P_s$, and the output $\theta_r$ in the s-domain, where s now denotes the Laplace operator, is:

$$Y(s) = \frac{b_1 s + b_0}{a_2 s^2 + a_1 s + a_o} P_s(s) \quad (42)$$

$a_0 = R_1 + R_2 + R_3$;  $a_1 = C_1 R_1 R_3 + C_1 R_1 R_2 + C_2 R_2 R_3 + C_2 R_1 R_2$; $a_2 = C_1 C_2 R_1 R_2 R_3$;
where
$b_0 = R_1 R_2 + R_1 R_2 K + R_2 R_3 K$; $b_1 = C_1 R_1 R_2 R_3 K$.

When the input to the hybrid thermal model is a step signal with a magnitude c, the output, in the time domain, is:

$$y(t) = \alpha \cdot u(t) + \beta_1 e^{\lambda_1 t} + \beta_2 e^{\lambda_2 t} \quad (43)$$

where $$\alpha = \frac{b_0 c}{a_0};$$

u(t) is a unit step;

$$\lambda_1 = \frac{-a_1 + \sqrt{a_1^2 - 4a_2 a_0}}{2a_2}; \lambda_2 \frac{-a_1 - \sqrt{a_1^2 - 4a_2 a_0}}{2a_2};$$

$$\beta_1 = \frac{(b_1 \lambda_1 + b_0)c}{a_2(\lambda_1 - \lambda_2)\lambda_1}; \text{ and } \beta_2 = \frac{(b_1 \lambda_2 + b_0)c}{a_2(\lambda_2 - \lambda_1)\lambda_2}.$$

In Equation (43), $\alpha$ represents the magnitude of the steady-state rotor temperature; $\beta_1 e^{\lambda_1 t}$ and $\beta_2 e^{\lambda_2 t}$ correspond to the rotor thermal transient.

*Information Guide for General Purpose Industrial AC Small and Medium Squirrel-Cage Induction Motor Standards*, NEMA Standard MG1-2003, August 2003, specifies the major physical dimensions of induction machines up to 100 hp, with squirrel-cage rotors. Analysis of these design specifications gives a typical range for the thermal parameters $R_1$, $R_2$, $R_3$, $C_1$ and $C_2$ in the hybrid thermal model. Therefore, for a typical small-size, mains-fed induction machine, $\beta_1 e^{\lambda_1 t}$ corresponds to a slow exponential change with large magnitude, while $\beta_2 e^{\lambda_2 t}$ corresponds to a fast but rather small thermal transient. Since the latter term vanishes quickly, $\beta_1 e^{\lambda_1 t}$ is identified as the dominant component in the rotor thermal transient. Similar conclusions can also be drawn for the stator thermal transient. Consequently, Equation (43) is simplified to the following:

$$y(t) = \alpha \cdot u(t) + \beta_1 e^{\lambda_1 t} = \alpha \cdot u(t) + \beta_1 e^{\frac{t}{\tau_{th}}} \quad (44)$$

where $\tau_{th}$ is the thermal time constant obtained from the rotor temperature, estimated from the rotor temperature estimation algorithm.

As a consequence of the strong correlation between the rotor and stator temperatures at running overload conditions, the stator winding thermal transient has the same thermal time constant as the rotor.

Since a typical small-size, mains-fed induction machine's internal losses are dissipated chiefly through the stator to the ambient, and the thermal resistance $R_1$ is directly connected to the stator side in the full-order HTM in FIG. 7, $R_1$ is the most significant factor in determining the steady-state rotor temperature and its thermal time constant in a thermal transient. Due to the strong correlation between the rotor and stator temperatures, $R_1$ is also the most important factor in determining the steady-state stator temperature and its thermal time constant in a thermal transient. The stator steady-state temperature is relatively insensitive to the changes in $R_2$ and $R_3$.

To ensure comprehensive motor overload protection under the running overload condition, an online parameter tuning algorithm is used to protect the motor against running overloads with stator current between 100% and 200% of the motor's rated current.

Figure 8:
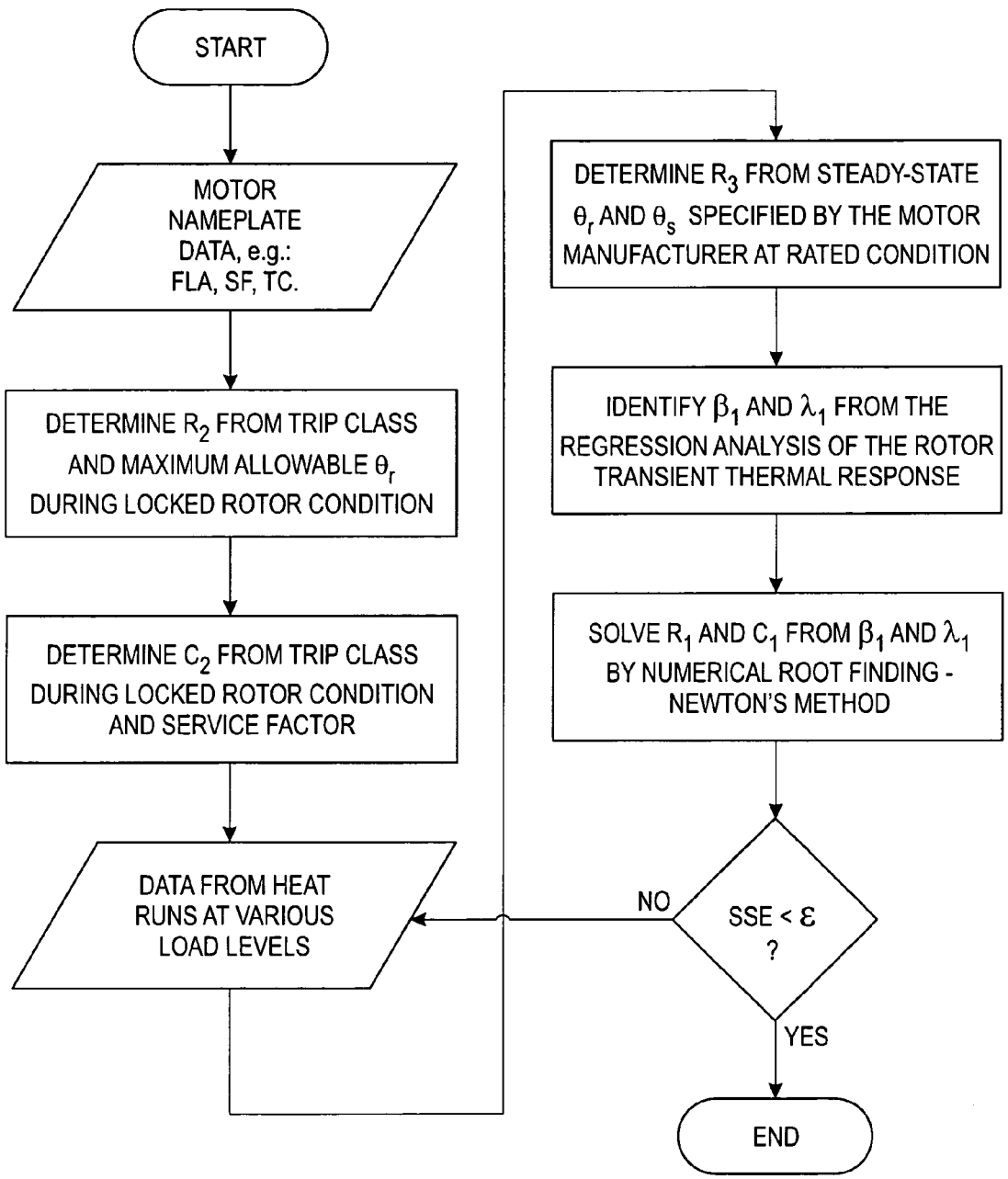
FIG. 8 is a full-order hybrid thermal model of an induction motor.

FIG. 8 shows the flowchart of the online parameter tuning algorithm. $R_2$ and $C_2$ are first computed offline from the motor nameplate data, including the full load current, the service factor and the trip class. Then $R_1$, $R_3$ and $C_1$ are calculated online based on the data from heat runs at various load levels.

To check whether the tuned hybrid thermal model matches the motor's true thermal behavior, the sum of the squared error (SSE) is used as an index. It is defined as the error between the rotor temperature predicted by the hybrid thermal model and the rotor temperature estimated from the rotor resistance:

$$SSE = \sum_{n=1}^{N} [\theta_r^{HTM}(n) - \theta_r^{EST}(n)]^2 \quad (45)$$

where N is the number of samples used in computing SSE.

Once the SSE becomes smaller than a predetermined threshold value $\epsilon$, the tuning is done. Otherwise, a mismatch exists between the hybrid thermal model and the motor's true thermal operating condition, and more iterations are needed with additional data from heat runs to tune the parameters until a solution is found.

Since $R_1$ is more closely related to the motor cooling capability than $R_2$ and $R_3$ due to the heat flow inside an induction machine, $R_1$ is the focus of the online parameter tuning algorithm. The tuning of $R_1$ alone can yield a sufficiently accurate estimate of the stator winding temperature.

Figure 9:
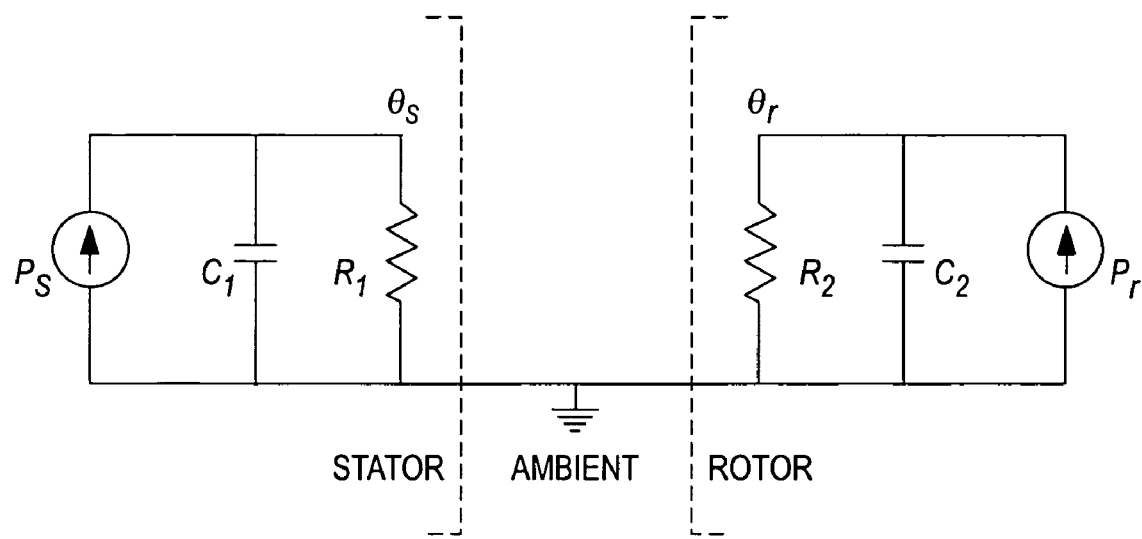
FIG. 9 is a decoupled hybrid thermal model of an induction motor under a locked rotor condition.

The thermal parameters $R_2$ and $C_2$ are determined from the motor specifications at the locked rotor condition. When the rotor is locked, there is no ventilation in the air gap. Consequently, it can be assumed that no heat is transferred across the air gap by means of laminar heat flow during this short interval. Then this locked rotor condition is modeled by letting $R_3 \to \infty$ and decoupling the full-order HTM into two separate parts, the stator part and the rotor part, as shown in FIG. 9.

During locked rotor conditions, the thermal capacity of an induction machine is usually rotor limited. At an ambient temperature of 40° C., a typical maximum allowable rotor temperature of 300° C. is assumed.

Associated with the rotor thermal capacity at locked rotor conditions, the trip class is defined as the maximum time (in seconds) for an overload trip to occur when a cold motor is subjected to 6 times its rated current. It is related to $R_2$ and $C_2$ by:

$$TC = R_2 C_2 \ln\left(\frac{6^2}{6^2 - SF^2}\right) \qquad (46)$$

where TC is the trip class given by the motor manufacturer; and SF is the service factor.

Alternatively, a manufacturer may specify a Stall Time and the Locked Rotor Current. One may substitute Stall Time for Trip Class in Equation (46) and the ratio of Locked Rotor Current to Full Load Current for the constant 6, to obtain the rotor thermal parameters.

The rise of the rotor temperature during a locked rotor condition is:

$$\theta_r(t)|_{t=TC} - \theta_r(t)|_{t=0} = P'_r R_2 \left(1 - e^{-\frac{t}{R_2 C_2}}\right)\bigg|_{t=TC} \qquad (47)$$

where $P'_r$ is the rotor $I^2R$ loss at the locked rotor condition; $\theta_r(t)|_{t=0}$ is the initial rotor temperature; and $\theta_r(t)|_{t=TC}$ is the rotor temperature after TC elapsed.

Substituting $\theta_r(t)|_{t=TC}$ and $\theta_r(t)|_{t=0}$ in Equation (47) with 300° C. and 40° C., respectively; and combining Equations (47) and (46) to obtain $R_2$ and $C_2$:

$$R_2 = \frac{9360}{P'_r \cdot SF^2}. \qquad (48)$$

$$C_2 = \frac{P'_r \cdot SF^2 \cdot TC}{9360 \cdot \ln\left(\frac{6^2}{6^2 - SF^2}\right)} \qquad (49)$$

The thermal parameters $R_3$, $R_1$ and $C_1$ are calculated online based on the data from heat runs at various load levels. First, $R_3$ is determined from the motor specifications at the rated condition:

$$R_3 = \frac{\theta_r(t)|_{t=\infty} - \theta_s(t)|_{t=\infty}}{P_r - \frac{\theta_r(t)|_{t=\infty}}{R_2}} \qquad (50)$$

where $\theta_s(t)|_{t=\infty}$ and $\theta_r(t)|_{t=\infty}$ are the steady state stator and rotor temperature rises above the ambient at the rated condition, respectively; $P_r$ is the rotor $I^2R$ loss at the rated condition; and $R_2$ is computed previously by Equation (48). $\theta_s(t)|_{t=\infty}$ is either specified in the motor manufacturer's data sheet or obtained by measuring the stator resistance at the rated condition through the direct current injection method.

Then the coefficients in the dominant component of the rotor thermal transient, $\beta_1$ and $\lambda_1$, are identified. The identification process involves regression analysis, i.e., fitting an exponential function in the same form as Equation (44) to the rotor thermal transient, which is derived from the estimated rotor resistance.

Finally, $R_1$ and $C_1$ are solved from $\beta_1$ and $\lambda_1$ by numerical root finding techniques. Given $R_2$, $R_3$ and $C_2$, $R_1$ and $C_1$ are related to $\beta_1$ and $\lambda_1$:

$$\begin{cases} \beta_1 = f_1(R_1, C_1) \\ \lambda_1 = f_2(R_1, C_1) \end{cases} \qquad (51)$$

where the nonlinear functions $f_1$ and $f_2$ are formulated from Equation (44). Newton's method is chosen as the numerical root finding method due to its superior convergence speed.

After successful completion of the tuning, SSE is constantly monitored to detect changes in the motor's cooling capability, such as those caused by a broken cooling fan or a clogged motor casing. If such a change is detected, $R_1$ is tuned again since only this parameter is highly correlated with the motor's cooling capability. In this case, $\lambda_1$ is first updated through regression analysis. Then it is expressed as a function of $R_1$:

$$\lambda_1 = f'_2(R_1) \qquad (52)$$

where $f'_2$ has the same form as $f_2$ in Equation (51), but $C_1$ is now regarded as a known constant. Finally a new $R_1$ is solved from Equation (52) by the Newton's method to reflect the change in the motor's cooling capability.

Through the online parameter tuning, the hybrid thermal model ensures a correct prediction of the stator winding temperature, even under an impaired cooling condition, thereby providing a comprehensive overload protection to the motor.

Most induction machines of TEFC (totally enclosed fan-cooled) design in the low power range (<30 hp) are characterized by a small air gap (typically between 0.25 mm and 3 mm) to increase the efficiency. In addition, the machines are shielded by frames to prevent the free exchange of air between the inside and outside of the case. Therefore, among the rotor cage losses that are evacuated through the air gap, a significant portion is transferred to the stator slots, while the rest is passed to the endcap air inside the motor. These rotor cage losses, combined with the stator losses, travel through the motor frames and finally reach the ambient. Hence the rotor conductor temperature and the stator winding temperature are correlated due to the machine design.

Figure 10:
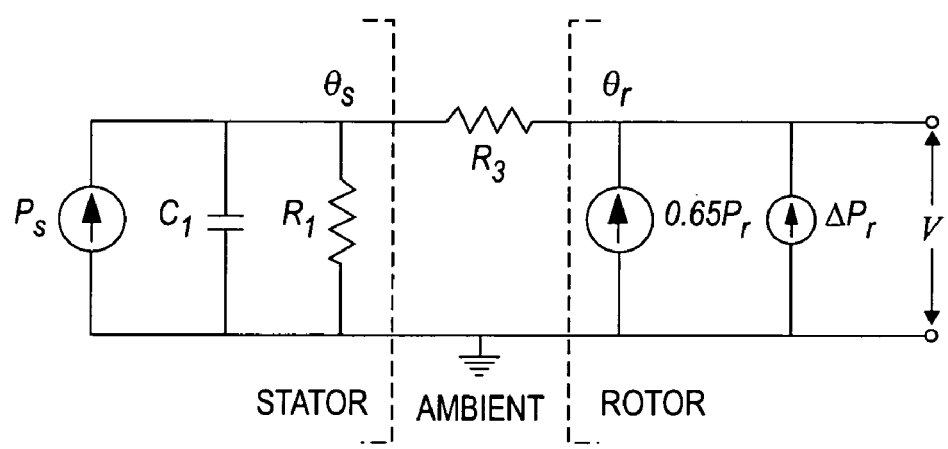
FIG. 10 is a reduced-order hybrid thermal model of an induction machine.

Based on the analysis of the full-order hybrid thermal model, a reduced-order hybrid thermal model may be used, as illustrated in FIG. 10. This simplified thermal model is capable of predicting the stator winding temperature rise from only current and rotor speed information. The model parameters are loosely associated with aspects of the machine design.

The quantities $\theta_s$ and $\theta_r$ are temperature rises [° C.] above ambient on the stator and rotor, respectively. The power input $P_s$ [Watt] is associated chiefly with the $I^2R$ loss generated in the stator winding. The power input $P_r$ is associated mainly with the $I^2R$ loss in the rotor bars and end rings. They are calculated from the induction machine electrical model. The thermal resistance $R_1$ [° C./W] represents the heat dissipation capability of the stator to the surrounding air through the combined effects of heat conduction and convection, while $R_3$ is associated with the heat transfer from the rotor to the stator through the air gap, mainly by means of conduction and convection. The thermal capacitance $C_1$ [J/° C.] is determined by the overall thermal capacities of the stator winding, iron core and motor frame. The voltage V in FIG. 10 represents the rotor temperature estimated from the rotor resistance. Compared with the full-order HTM, $R_1$ in the reduced-order HTM is the same as $R_1$ in FIG. 7, $R_3$ in the reduced-order HTM is the same as $R_3$ in FIG. 9, and $C_1$ in the reduced-order HTM is the same as $C_1$ in FIG. 7.

According to I. Boldea and S. A. Nasar, *The Induction Machine Handbook*. Boca Raton: CRC Press, 2002, p. 406, at rated speed, approximately 65% of the rotor cage losses are dissipated through the air gap to the stator and ambient. This figure may be different at other operating points. Therefore, $\Delta P_r$ is incorporated in the reduced-order HTM to indicate the variation of power losses across the air gap at different load levels. This reduced-order HTM not only correlates the stator winding temperature with the rotor conductor temperature, but also unifies the thermal model-based and the parameter-based temperature estimators. In addition, the reduced-order HTM is of reasonable complexity for real time implementation. With proper tuning, the HTM provides a more flexible approach than most state-of-the-art relays to the problem of estimating the stator winding temperature under running overload conditions. The increased flexibility and versatility are due to the real time tuning of the HTM thermal parameters to reflect the true thermal characteristics of the motor.

The operation of the reduced-order HTM can be divided into two stages:

Stage I involves the online parameter estimation of the thermal parameters in the hybrid thermal model; while Stage II involves the optimal stator winding temperature estimation based on an adaptive Kalman filtering approach.

In Stage I, a reliable tracking of the stator temperature requires that three thermal parameters, $C_1$, $R_1$ and $R_3$ be determined. Online parameter estimation can be performed with information from estimated rotor temperature to yield fairly accurate values for $C_1$, $R_1$ and $R_3$.

Sophisticated signal processing techniques are required to tune the thermal parameters $C_1$, $R_1$ and $R_3$ of the reduced-order HTM from its transfer function:

$$H(s) = \frac{\theta_r(s)}{P_s(s)} = \frac{R_1(1+0.65K)}{sR_1C_1+1} + 0.65KR_3 \quad (53)$$

where s is the Laplace operator in the s-domain, K is the ratio of rotor $I^2R$ losses to stator $I^2R$ losses, defined by Equation (41). Adaptive recursive filtering techniques based on an infinite impulse response (IIR) filter can be used to estimate the thermal parameters in the reduced-order HTM.

In Stage II, since the reduced-order HTM reasonably correlates the stator winding temperature with the rotor conductor temperature without explicit knowledge of the machine's physical dimensions and construction materials, an adaptive Kalman filter is constructed to track the stator winding temperature based on the reduced-order HTM. A bias term is incorporated in the Kalman filter equations to allow for the variations in power losses at different motor operating points. By using the rotor conductor temperature estimated from the rotor resistance, the variances in the Kalman filter are identified via a correlation method. Once the variances and the bias are determined, the Kalman filter becomes an optimal online stator winding temperature estimator.

In the continuous-time domain, the hybrid thermal model is described by the following equations:

$$C_1 \frac{d\theta_s(t)}{dt} + \frac{\theta_s(t)}{R_1} = P_s(t) + 0.65P_r(t) + \Delta P_r(t) \quad (54)$$

$$\theta_r(t) = \theta_s(t) + [0.65P_r(t) + \Delta P_r(t)] \cdot R_3 \quad (55)$$

When Equations (54) and (55) are transformed into the discrete-time domain with a sampling interval T and written in the discrete Kalman filter form, they become:

Process equation: $x(n) = Ax(n-1) + B[u(n-1) + \Delta u(n-1)] + w(n)$ (56a)

Measurement equation: $y(n) = Cx(n) + D[u(n) + \Delta u(n)] + v(n)$ (56b)

where $x(n)$ is $\theta_s(n)$; A is $e^{-\frac{T}{R_1C_1}}$;

B is $R_1(1 - e^{-\frac{T}{R_1C_1}}) \cdot [1 \quad 1]$; $u(n)$ is $[P_s(n) \; 0.65P_r(n)]^T$;

$\Delta u(n)$ is $[1 \quad \Delta P_r(n)]^T$; $y(n)$ is $\theta_r(n)$; C is 1; D is $R_3 \cdot [0 \quad 1]$.

In Equation (56a), w(n) corresponds to the modeling error of the HTM. In Equation (56b), v(n) designates the measurement noise. They represent the intrinsic uncertainties associated with the HTM and decide the optimal combination of the output from the thermal model-based temperature estimator and the output from the parameter-based temperature estimator. Let $\hat{x}(n|n)$ denote the best estimate of x(n) at time n given the measurements y(i) for i=1, 2, ..., n, and $\hat{x}(n|n-1)$ denote the best estimate of x(n) at time n given the measurements up to n−1. P(n|n) is the error covariance matrix computed from x(n) and $\hat{x}(n|n)$, and similarly P(n|n−1) computed from x(n) and $\hat{x}(n|n-1)$. The recursive estimate of x(n), which is the stator winding temperature rise, is:

Prediction: $\hat{x}(n|n-1)=A\hat{x}(n-1|n-1)+B[u(n-1)+\Delta u(n-1)]$ (57a)

Innovation: $P(n|n-1)=AP(n-1|n-1)A^T+Q_w(n)$ $K(n)=P(n|n-1)C^T[CP(n|n-1)C^T+Q_v(n)]^{-1}$ $P(n|n)=[I-K(n)C]P(n|n-1)$ (57b)

Correction: $\hat{x}(n|n)=\hat{x}(n|n-1)+K(n)\{y(n)-C\hat{x}(n|n-1)-D[u(n)+\Delta u(n)]\}$ (57c)

By computing the appropriate Kalman gain K(n), $\hat{x}(n|n)$ is obtained as an estimate of the stator winding temperature with minimum mean-square error. Rotor conductor temperature from the parameter-based temperature estimator 14 is used as y(n) in each step to provide correction to the estimate of stator winding temperature from the thermal model. Therefore, built on the hybrid thermal model, the adaptive Kalman filter provides an optimal estimate of the stator winding temperature.

Figure 11:
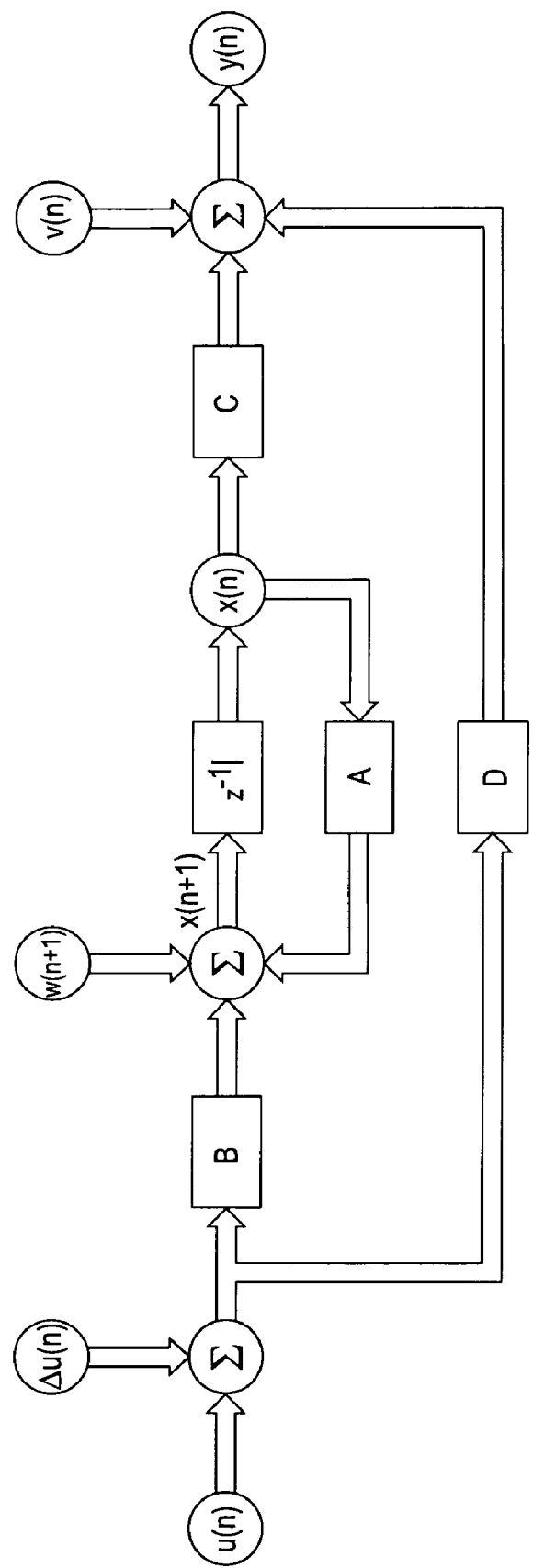
FIG. 11 is a diagram of the overall architecture of an adaptive Kalman filter with noise identification and input estimation, for use in one implementation of the system of FIG. 1, FIGS. 12*a* and 12*b* are positive and negative sequence equivalent circuits for an induction motor.

The HTM and the subsequent formulation of the Kalman tilter present an adaptive structure in estimating the stator winding temperature without any temperature sensors. The adaptive structure takes into account the bias and the variances through $\Delta u(n)$, w(n) and v(n) in Equations (56a) and (56b). However, as indicated in Equations (57a) through (57c), $Q_w(n)$, $Q_v(n)$, and $\Delta u(n)$ must be known before the Kalman filter starts to produce an optimal estimate of the stator winding temperature. This problem is solved in two steps: (1) the hybrid thermal model described in Equations (56a) and (56b) is split into two subsystems: a stochastic subsystem driven purely by noise terms w(n) and v(n), and a deterministic subsystem driven purely by input terms u(n) and $\Delta u(n)$; and (2) the noise identification technique is applied to the stochastic subsystem to obtain $Q_w(n)$ and $Q_v(n)$, and the input estimation method to the deterministic subsystem to obtain $\Delta u(n)$. FIG. 11 shows the overall architecture of the algorithm. It illustrates the system parameters, the signal flow and the location of noises and bias terms for the adaptive Kalman filtering system. In FIG. 12, the system parameters A, B, C and D are defined as in Equations (56a) and (56b); $Z^{-1}$ represents a unit delay in the discrete-time domain; I is an identity matrix. The signal flow is from the left to the right, with u(n) (the power losses) as the input and the y(n) (the rotor temperature) as the output. The noise terms are w(n+1) and v(n), the bias term is Δu(n).

There is an intrinsic modeling error associated with the hybrid thermal model. When formulating the Kalman filter, this modeling error is quantified by an load-independent equivalent noise w(n). Similarly, v(n) is used to indicate the presence of measurement noise in the rotor temperature, which is calculated from the parameter-based temperature estimator. v(n) consists of a load-independent part $v_1(n)$ corresponding to the uncertainty from the measurement devices, and a load-dependent part $v_2(n)$ originating from the slip-dependent rotor resistance estimation algorithm. The noise terms $v_1(n)$ and $v_2(n)$ are assumed to be uncorrelated due to their load dependencies.

The autocorrelation matrices $Q_w(n)$ and $Q_{v1}(n)$ capture the statistical properties of w(n) and $v_1(n)$, respectively. They can be identified at rated load, where Δu(n)=0, by observing the property of the innovation process, y(n), defined as:

$$\gamma(n) = y(n) - C\hat{x}(n|n-1) - Du(n) \tag{58}$$

The autocorrelation function of γ(n) can be used to identify $Q_w(n)$ and $Q_{v1}(n)$ when the innovation process is not a white Gaussian noise (WGN). Also, the autocorrelation matrix of the load-dependent measurement noise $Q_{v2}(n)$ is determined from the properties of the rotor resistance estimation algorithm. Because $v_1(n)$ and $v_2(n)$ are uncorrelated, $Q_v(n) = Q_{v1}(n) + Q_{v2}(n)$. After the successful identification of $Q_w(n)$ and $Q_v(n)$, the Kalman filter is able to give an optimal estimate of the stator winding temperature at rated load.

When the motor is operating at load levels different from the rated condition, the power losses that traverse the air gap from the rotor to the stator may no longer be fixed at 65% of the total rotor cage losses. This change, denoted by Δu, is detected by regression analysis. In the deterministic subsystem, when the rotor temperature differences at two instants, $\Delta\theta_r(t_1)$ and $\Delta\theta_r(t_1+\Delta t)$, are acquired after the load changes from u to u+Δu, then $\Delta P_r$ is found by solving the following equation:

$$R_1 C_1 \ln \frac{\Delta P_r(R_1+R_3) - \Delta\theta_r(t_1)}{\Delta P_r(R_1+R_3) - \Delta\theta_r(t_1+\Delta t)} = \Delta t \tag{59}$$

The rotor temperature difference $\Delta\theta_r(t)$ is defined to be the difference between the real rotor temperature, derived from the rotor resistance, and the rotor temperature predicted from the reduced-order HTM without considering the presence of Δu.

Once $Q_w(n)$, $Q_v(n)$ and Δu have been determined, the adaptive Kalman filter is initiated and produces an optimal estimate of the stator winding temperature at different load levels.

The additional heating created by an unbalanced power supply is taken into account by adapting the model inputs to reflect the additional heating due to the presence of negative sequence current.

The HTM adaptation to an unbalanced supply involves the calculation of additional losses in $P_s$ and $P_r$ introduced by the negative sequence current. Voltage unbalance is a common phenomenon in power distribution systems. A small unbalance in voltage may lead to significant unbalance in current.

Figure 12B:
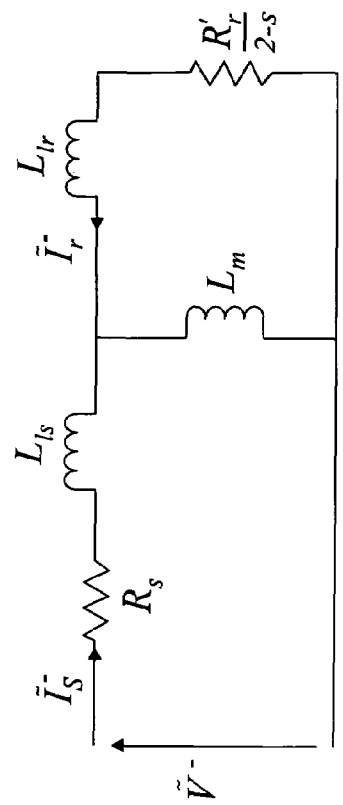

This can be explained by the induction motor negative sequence equivalent circuit shown in FIG. 12b.

Figure 12A:
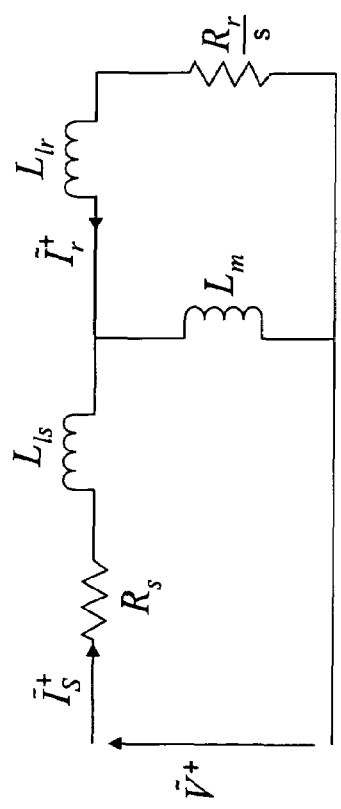
Figure 13B:
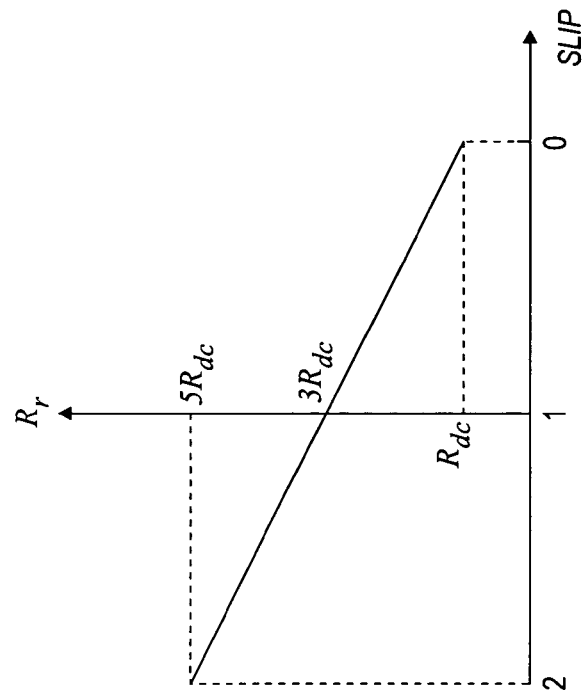
FIGS. 13*a* and 13*b* are graphs showing the relationship between rotor resistance and frequency/slip.
Figure 13A:
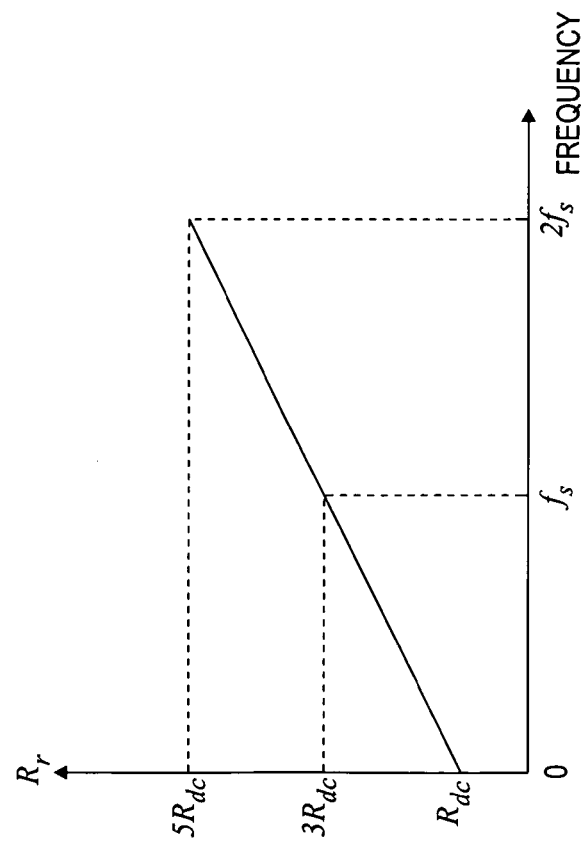

Due to the skin effect, the rotor resistance is a function of supply frequency. In addition, rotor resistance is also dependent on the physical dimensions of rotor bars. It is a common practice to model the relationship between rotor resistance and supply frequency with a linear model, as shown in FIG. 13a according to E. O. Schweitzer and S. E. Zocholl, "Aspects of overcurrent protection for feeders and motors," in *Industrial and Commercial Power Systems Technical Conference*, May 1994, pp 245-251. A typical value of $R_r$ at power frequency $f_s$ is three times its dc resistance. Thus during normal operation, the positive sequence rotor resistance in FIG. 12a is $R_r \approx R_{dc}$, and the negative sequence rotor resistance in FIG. 12b is $R'_r \approx 5R_{dc}$. FIG. 13b interprets the same physical phenomenon as FIG. 13a, but in terms of rotor resistance and slip.

Figure 14:
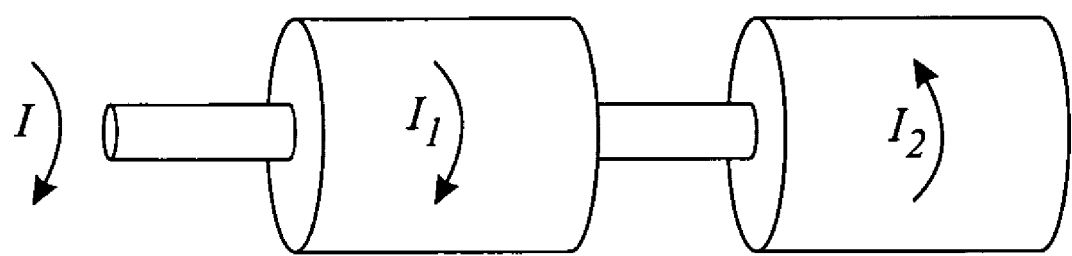
FIG. 14 is a diagrammatic illustration of the torques produced by positive and negative sequence currents.

The current unbalance introduces excessive rotor heating associated with the negative sequence current component. FIG. 14 explains the rotor heating due to the negative sequence current component according to B. N. Gafford, W. C. Duesterhoeft, and C. C. Mosher, "Heating of induction motors on unbalanced voltages," AEEE Transactions *Power Apparatus and Systems*, vol. 78, pp. 282-288, 1959. The motor can be considered to have two tandem virtual rotors. One is driven only by the positive sequence current $I_1$, which is symmetrical and balanced. The other is driven only by counter-rotating negative sequence current $I_2$, directly related to unbalanced current; and producing torque in the reverse direction. The motor is designed to produce torque only from the positive sequence current component, not from the negative sequence current component, and thus the reverse torque produced by $I_2$ in the second rotor works against the main action of the motor. Because the negative work caused by $I_2$ stays within the rotor, it is completely transformed into heat and therefore has a far more significant effect on the rotor heating than $I_1$.

Based on the above analysis, the inputs to the HTM in FIG. 7 and FIG. 10, $P_s$ and $P_r$, should be modified to $P'_s$ and $P'_r$ to accommodate the additional heating produced on the stator and rotor side by negative sequence current as follows:

$$P'_s = P_s + P_s^-, \quad P'_r = P_r + P_r^- \tag{60}$$

where $P_s$ and $P_r$ are losses under normal balanced supply; and $P_s^-$ and $P_r^-$ are additional losses produced by negative sequence current. $P_s^-$ and $P_r^-$ are determined by:

$$\begin{cases} P_s^- = |\bar{I}_s^-|^2 R_s \\ P_r^- = |\bar{I}_r^-|^2 \dfrac{R'_r}{2-s} \end{cases} \tag{61}$$

The invention claimed is:

1. A method of estimating the stator winding temperature of an induction motor having a rotor and a stator, said method comprising:
   estimating the stator temperature from the motor current and the angular speed of the rotor using an online hybrid thermal model, wherein said hybrid thermal model approximates thermal characteristics of said rotor and stator.

2. The method of claim 1 further comprising
   estimating motor inductances from the stator resistance and samples of the motor terminal voltage and current, estimating the rotor resistance from samples of the motor terminal voltage and current, the angular speed of the rotor, and said estimated inductances, estimating a first rotor temperature from said estimated rotor resistance, and identifying thermal capacity and thermal impedance parameters of said hybrid thermal model online based on said estimated rotor temperature.

3. The method of claim 2 further comprising estimating a second rotor temperature using said hybrid thermal model, comparing said first and second estimated rotor temperatures and producing an error signal representing the difference between said first and second estimated rotor temperatures, and adapting the parameters of said hybrid thermal model online in response to said error signal when said error signal exceeds a predetermined threshold.

4. The method of claim 2 wherein said estimated motor inductances include (a) the stator leakage inductance, the rotor leakage inductance and the mutual inductance of said motor, or (b) the stator self inductance and the stator transient inductance.

5. The method of claim 2 wherein the positive sequence, fundamental components of said samples of the motor terminal voltage and current values are used in estimating said rotor resistance.

6. The method of claim 2 wherein said hybrid thermal model uses the angular speed of said rotor, samples of the motor terminal current, and said error signal representing the difference between said first and second estimated rotor temperatures.

7. The method of claim 1 which includes using said estimated stator temperature as an indication of the overload of said motor.

8. The method of claim 1 wherein initial values of selected parameters of said hybrid thermal model are determined from parameter values available from the motor manufacturer.

9. The method of claim 8 wherein said parameter values available from the motor manufacturer include at least one parameter selected from the group consisting of full load current, service factor, trip class, stator resistance, stall time, steady state temperature rise above ambient at full load condition, and NEMA machine design class for said motor.

10. The method of claim 1 wherein said hybrid thermal model is a full-order or reduced-order hybrid thermal model.

11. The method of claim 1 wherein said hybrid thermal model includes thermal capacitance values representing the thermal capacity of the stator core, windings and frame of said motor, and the thermal capacity of the rotor core, conductors and shaft.

12. The method of claim 1 wherein said hybrid thermal model includes thermal resistance values representing the heat dissipation capabilities of said stator and rotor, and the heat transfer from said rotor to said stator across an air gap between said stator and rotor.

13. A method of estimating the rotor resistance of an induction motor having a rotor and a stator, said method comprising estimating motor inductances from the stator resistance and samples of the motor terminal voltage and current, and estimating the rotor resistance from samples of the motor terminal voltage and current, the angular speed of the rotor, and said estimated inductances.

14. The method of claim 13 wherein said samples of said motor terminal voltage and current used in estimating said motor inductances are obtained by measuring the motor terminal voltage and current at a plurality of different load points, and computing the positive sequence, fundamental components of the measured voltage and current values.

15. The method of claim 13 wherein said samples of said motor terminal voltage and current used in estimating said rotor resistance are obtained by computing the positive sequence, fundamental components of the measured voltage and current values.

16. The method of claim 13 wherein said estimating of rotor resistance includes obtaining the slip of the motor, computing the ratio of rotor resistance to slip, and multiplying said ratio by said slip to obtain rotor resistance.

17. The method of claim 13 further comprising estimating the rotor temperature from said estimated rotor resistance.

18. The method of claim 13 further comprising estimating the rotor resistance from samples of the motor terminal voltage and current, the angular speed of the rotor, and said estimated inductances.

19. The method of claim 13 wherein said estimating of motor inductances includes forming equations in preselected parameters for each of a plurality of said load points, combining the equations for each operating point into a matrix equation, solving said matrix for said preselected parameters, and computing motor inductances from said preselected parameters.

20. A method of protecting an induction motor during running overloads, said motor having a rotor and a stator, said method comprising connecting the motor to an overload protection relay that can be tripped to interrupt power to the motor in the event of an overload, tracking the stator winding temperature of the motor during running overloads with a hybrid thermal model by online adjustment in the said hybrid thermal model, and tripping the overload protection relay in response to a predetermined thermal condition represented by the stator winding temperature tracked with said hybrid thermal model.

21. The method of claim 20 wherein said running overload is a condition in which the stator current is in the range of from about 100% to about 200% of the rated current of said motor.

22. The method of claim 20 wherein said hybrid thermal model uses the resistance of said rotor as an indicator of rotor temperature and thus of the thermal operating condition of said motor.

23. The method of claim 20 wherein said hybrid thermal model includes thermal resistances and capacitances of said rotor and stator.

24. The method of claim 20 wherein said hybrid thermal model includes adjustable thermal parameters, and further comprising tuning said thermal parameters of said hybrid thermal model to adapt said thermal parameters to the cooling capability of said motor.

25. The method of claim 24 wherein said tuning is effected when said hybrid thermal model does not match the actual thermal operating condition of said motor.

26. The method of claim 25 wherein the match between said hybrid thermal model and the actual thermal operating condition of said motor is measured by a function of the difference between a rotor temperature estimated using said hybrid thermal model and a rotor temperature estimated from the estimated rotor resistance, and said tuning is effected when said function exceeds a predetermined threshold.

* * * * *